(12) United States Patent
Sturcken et al.

(10) Patent No.: US 10,347,709 B2
(45) Date of Patent: Jul. 9, 2019

(54) METHODS OF MANUFACTURING INTEGRATED MAGNETIC CORE INDUCTORS WITH VERTICAL LAMINATIONS

(71) Applicant: Ferric Inc., New York, NY (US)

(72) Inventors: Noah Sturcken, New York, NY (US); Ryan Davies, New York, NY (US); Hao Wu, New York, NY (US); Michael Lekas, New York, NY (US)

(73) Assignee: Ferric Inc., New York, NY (US)

( * ) Notice: Subject to any disclaimer, the term of this patent is extended or adjusted under 35 U.S.C. 154(b) by 58 days.

(21) Appl. No.: 15/419,562

(22) Filed: Jan. 30, 2017

(65) Prior Publication Data

US 2018/0182841 A1 Jun. 28, 2018

Related U.S. Application Data

(63) Continuation-in-part of application No. 15/391,278, filed on Dec. 27, 2016, now Pat. No. 10,210,986.

(51) Int. Cl.
| | |
|---|---|
| *H01F 7/06* | (2006.01) |
| *H01L 49/02* | (2006.01) |
| *H01L 23/522* | (2006.01) |
| *H01L 21/3205* | (2006.01) |
| *H01L 21/288* | (2006.01) |

(Continued)

(52) U.S. Cl.
CPC ......... *H01L 28/10* (2013.01); *H01F 17/0033* (2013.01); *H01F 27/2804* (2013.01); *H01F 41/046* (2013.01); *H01F 41/26* (2013.01); *H01L 21/2885* (2013.01); *H01L 21/32051* (2013.01);

(Continued)

(58) Field of Classification Search
CPC ........... H01L 21/0274; H01L 21/32051; H01L 21/2885; H01L 23/5227; H01L 23/5226; H01L 28/10; H01F 2027/2809; H01F 27/24; H01F 27/2804; H01F 41/043; H01F 41/046

See application file for complete search history.

(56) References Cited

U.S. PATENT DOCUMENTS

| | | | |
|---|---|---|---|
| 3,868,561 A | 2/1975 | Matthes | |
| 5,757,056 A * | 5/1998 | Chui ................. | B82Y 10/00 257/108 |

(Continued)

OTHER PUBLICATIONS

D. P. Arnold et al., "Vertically Laminated Magnetic Cores by Electroplating Ni—Fe Into Micromachined Si", IEEE Transactions on Magnetics, Jul. 2004, p. 3060-3062, vol. 40, No. 4, IEEE.

(Continued)

*Primary Examiner* — Paul D Kim
(74) *Attorney, Agent, or Firm* — Intrinsic Law Corp.

(57) ABSTRACT

Methods of manufacturing are disclosed for an inductor that includes a magnetic core lying in a core plane. The magnetic core includes a vertical laminated structure with respect to the core plane of alternating ferromagnetic vertical layers and insulator vertical layers. An easy axis of magnetization can be permanently or semi-permanently fixed in the ferromagnetic vertical layers along a first axis orthogonal to the core plane. A hard axis of magnetization can be permanently or semi-permanently induced in the ferromagnetic vertical layers, the hard axis of magnetization lying in a plane that is orthogonal to the first axis.

19 Claims, 22 Drawing Sheets

(51) Int. Cl.
    *H01F 27/28* (2006.01)
    *H01F 41/04* (2006.01)
    *H01F 17/00* (2006.01)
    *H01F 41/26* (2006.01)

(52) U.S. Cl.
    CPC .. *H01L 23/5227* (2013.01); *H01F 2027/2809* (2013.01); *H01L 23/5226* (2013.01)

(56) References Cited

U.S. PATENT DOCUMENTS

| | | | |
|---|---|---|---|
| 6,110,609 A | 8/2000 | Hiramoto et al. | |
| 2013/0062729 A1* | 3/2013 | Hopper | H01L 28/10 257/531 |
| 2013/0288391 A1* | 10/2013 | Lee | H01L 45/16 438/3 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled-Magnetic-Core Inductors on Silicon Interposer Delivering 10.8A/mm(2)", Advances in Heterogeneous Integration, 2012, p. 3-5, Session 23.1, IEEE International Solid-State Circuits Conference, IEEE.

N. A. Sturcken, "Integrated Voltage Regulators with Thin-Film Magnetic Power Inductors", 2013, Columbia University.

\* cited by examiner

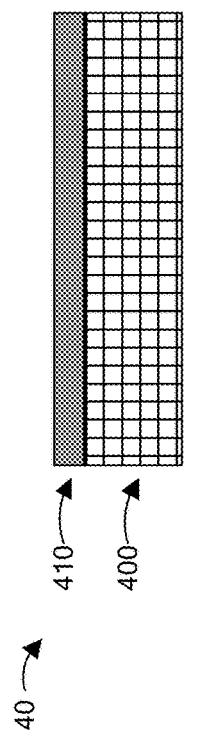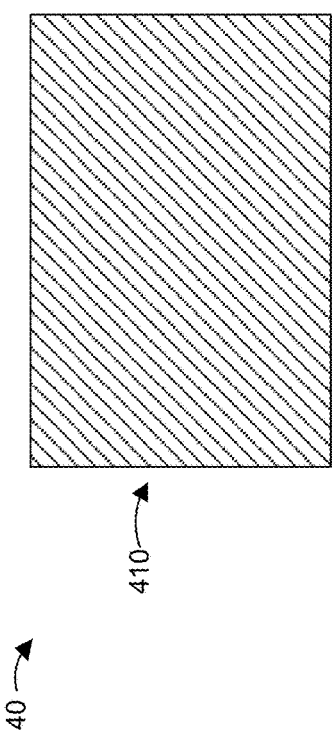

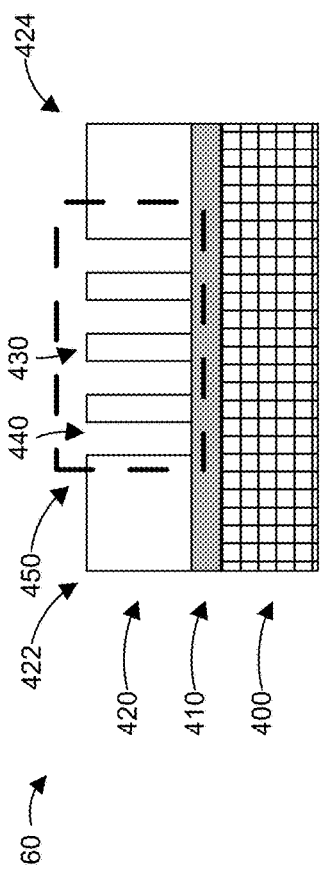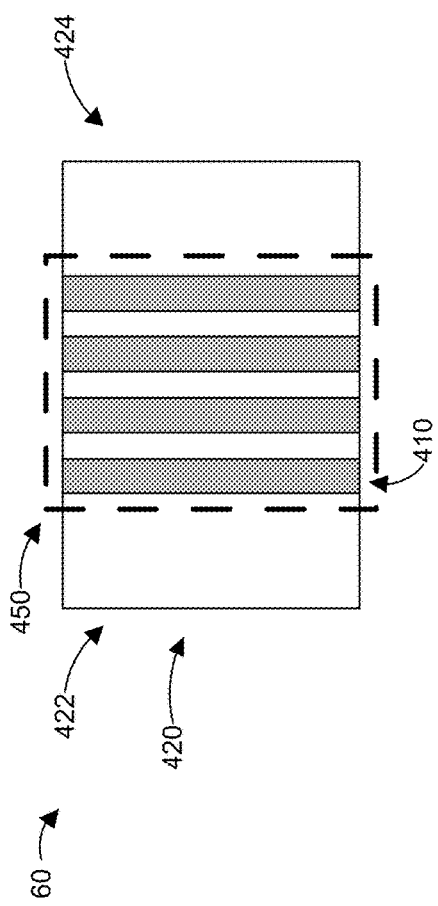

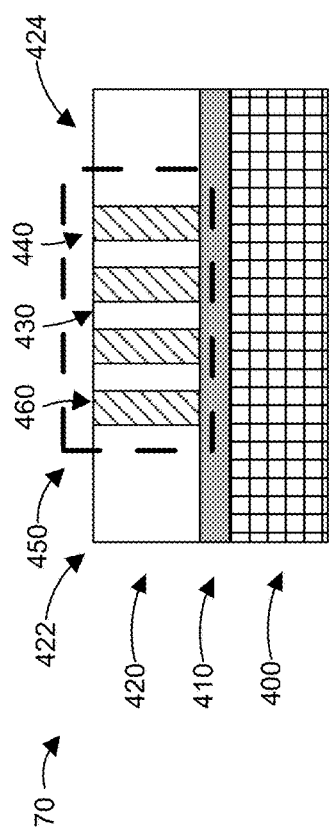
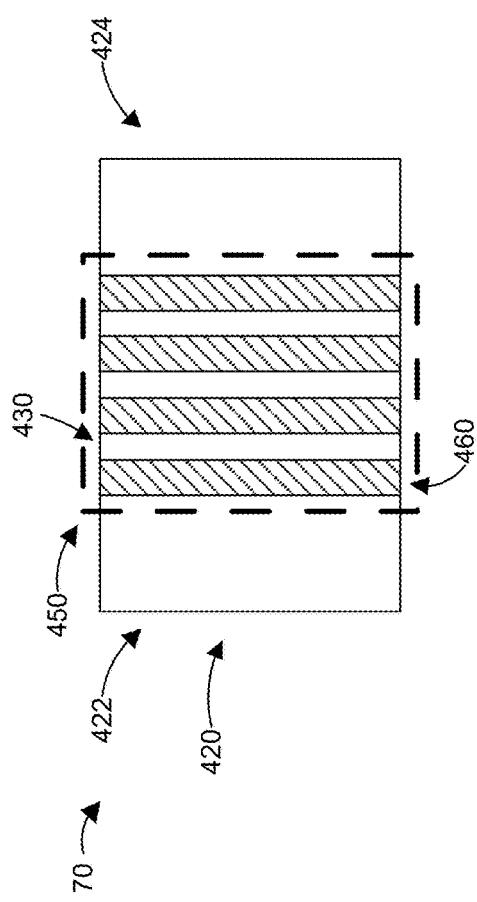

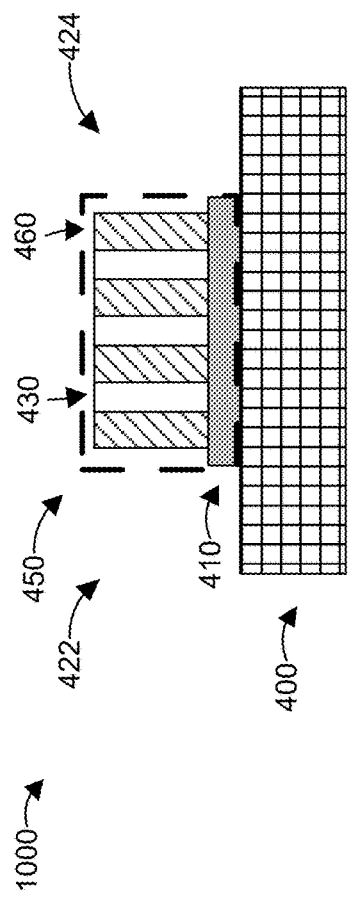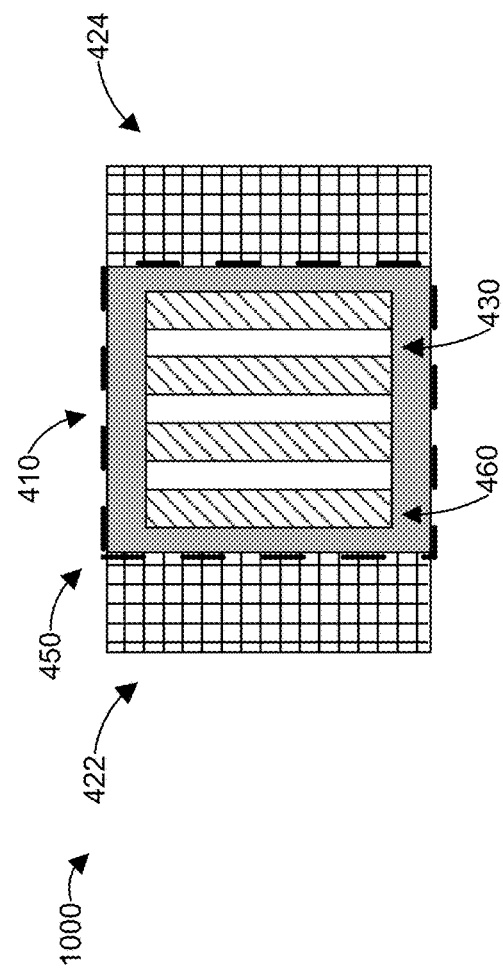

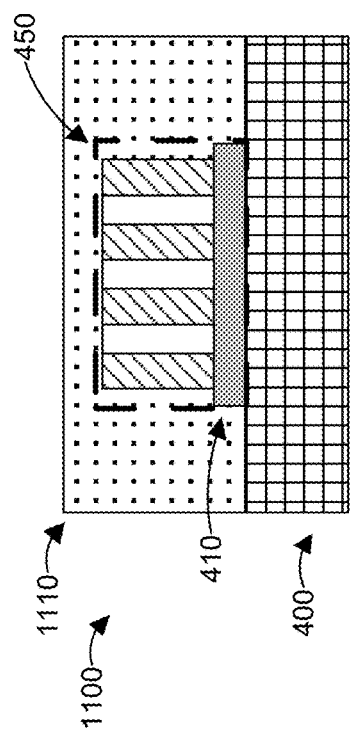
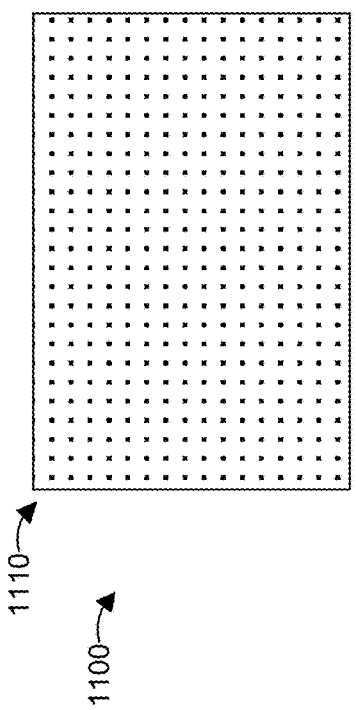

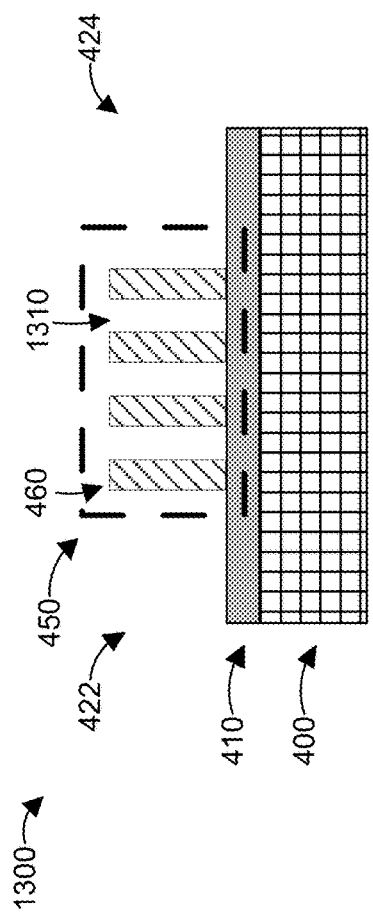
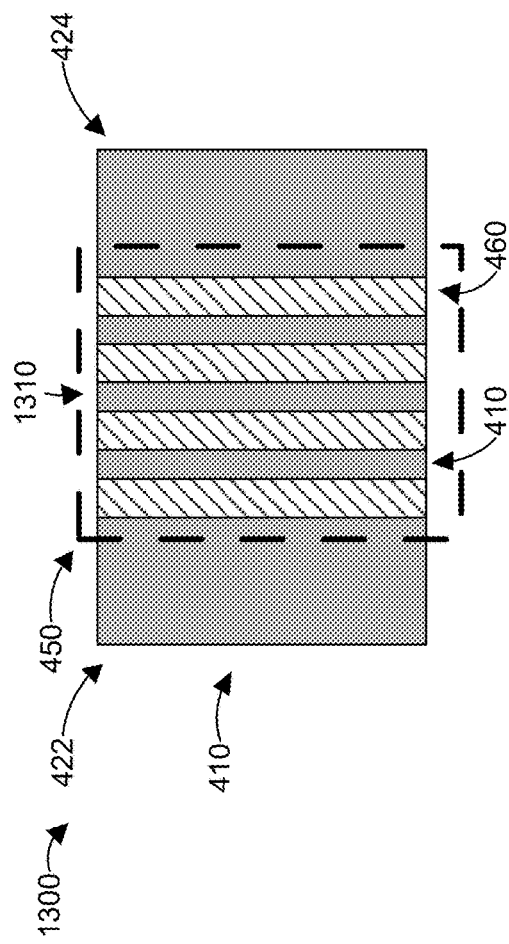
FIG. 13A
FIG. 13B

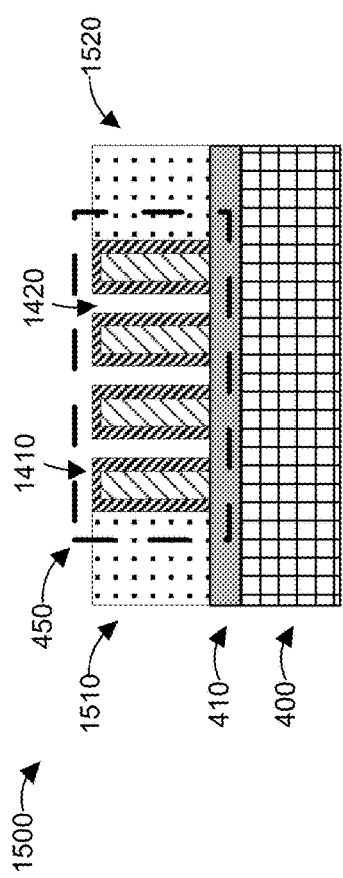
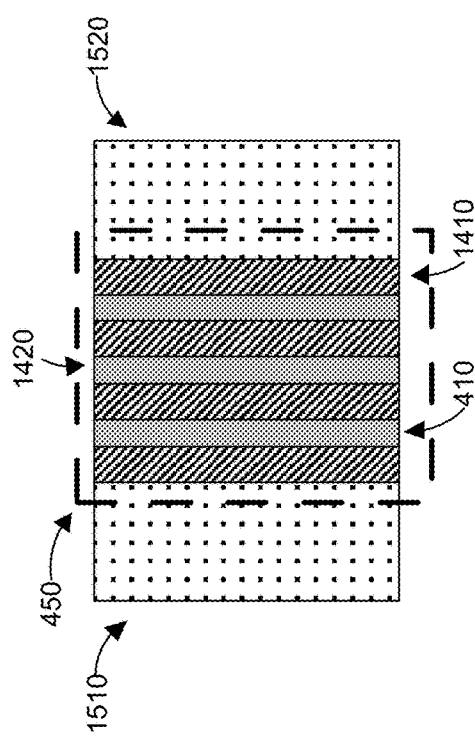
FIG. 15A
FIG. 15B

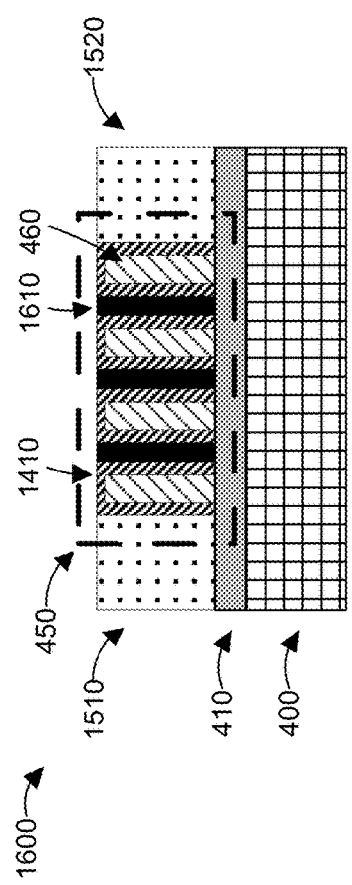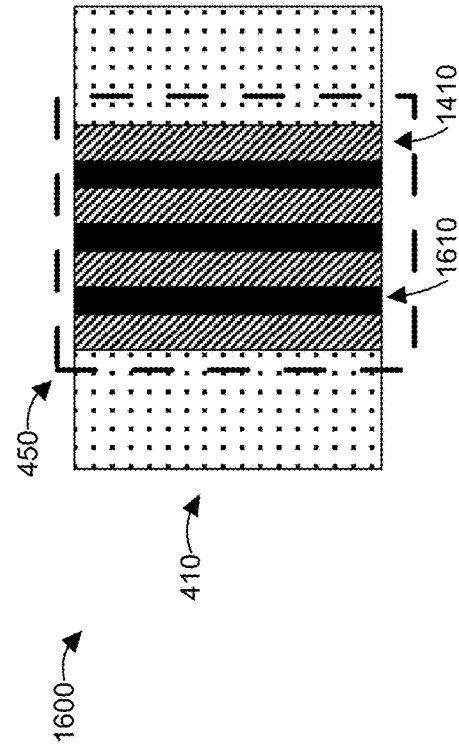

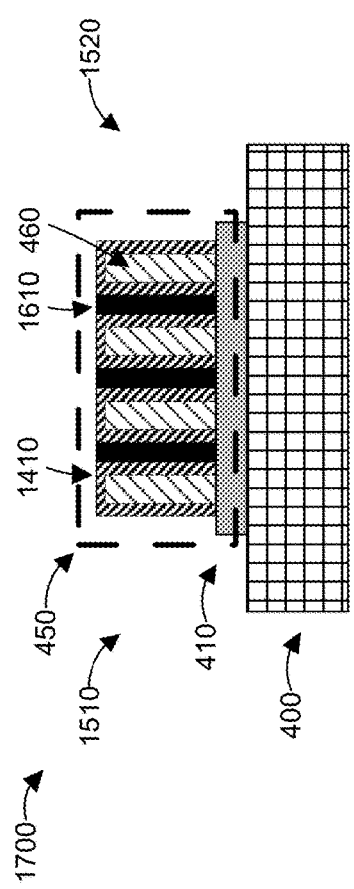
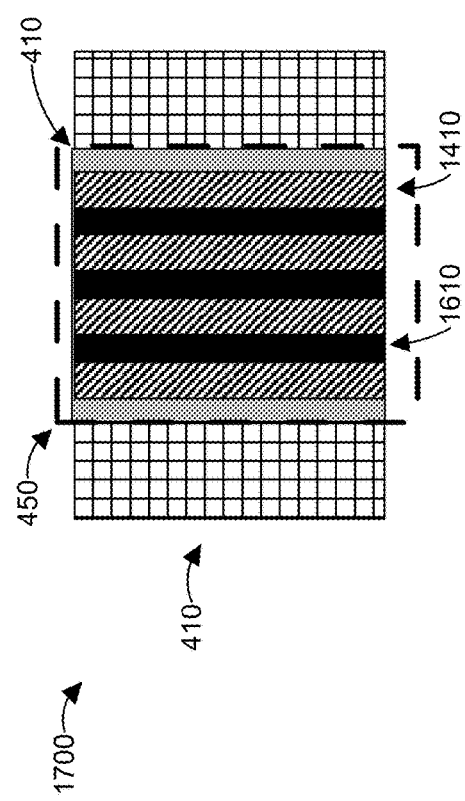

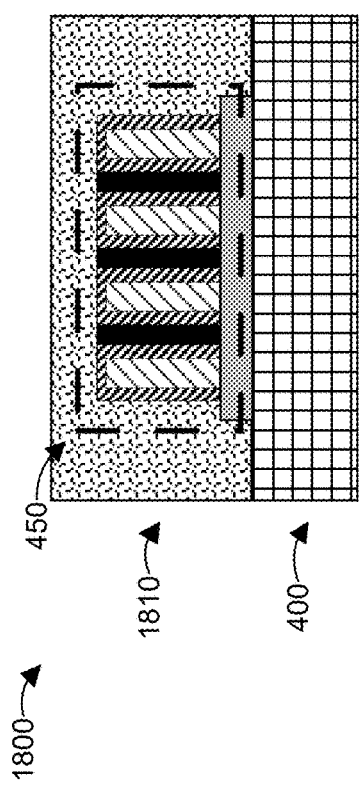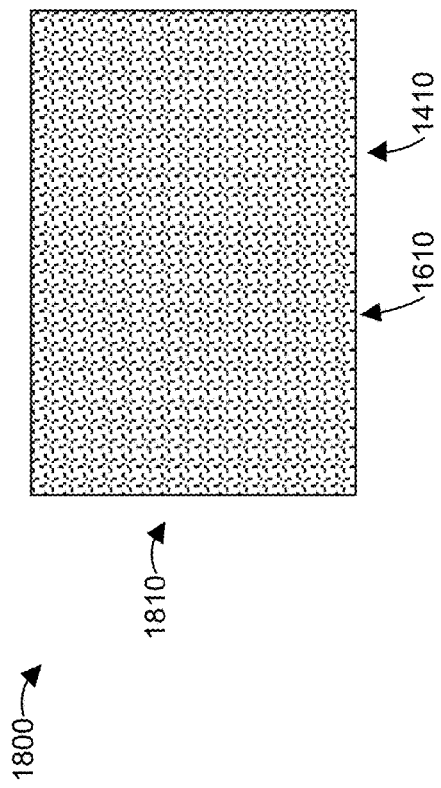

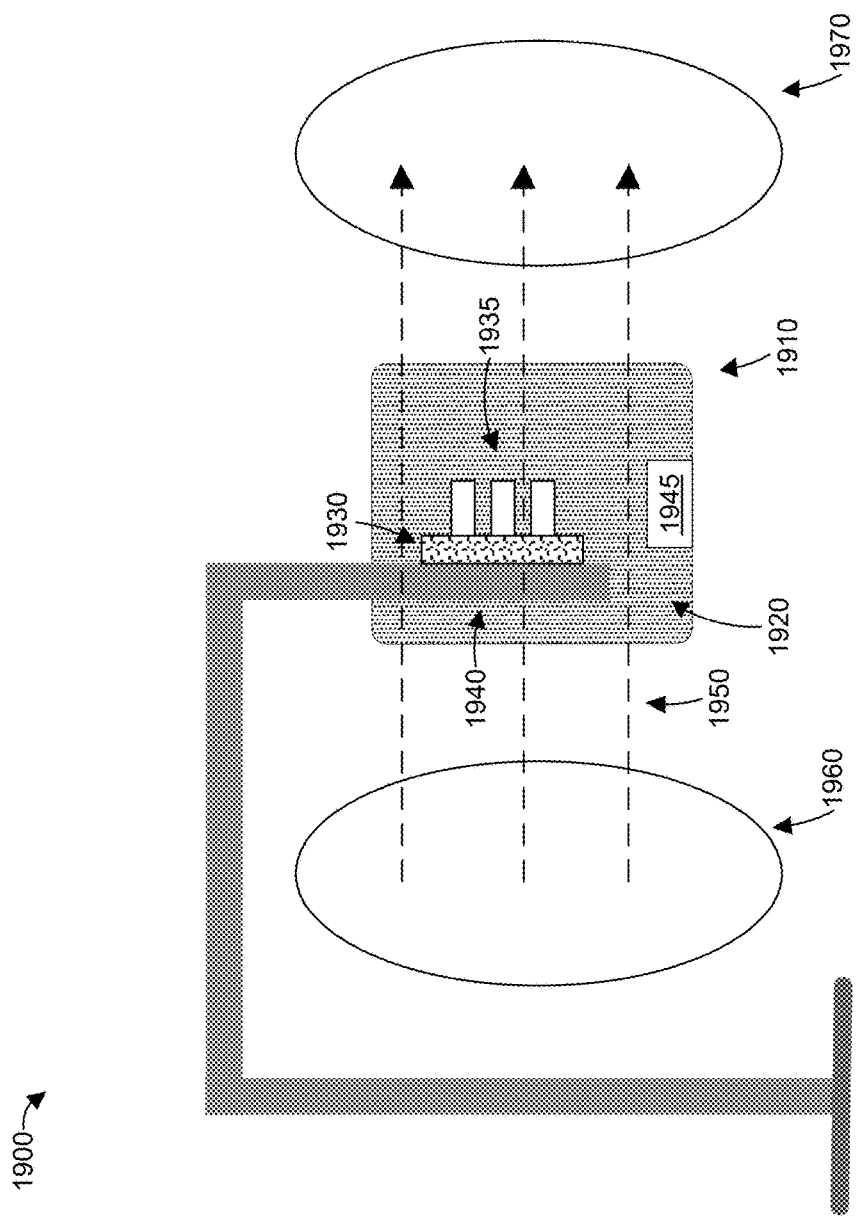

METHODS OF MANUFACTURING INTEGRATED MAGNETIC CORE INDUCTORS WITH VERTICAL LAMINATIONS

RELATED APPLICATIONS

This application claims priority to and is a continuation-in-part of U.S. patent application Ser. No. 15/391,278, filed on Dec. 27, 2016, now U.S. Pat. No. 10,041,620, entitled "Integrated Magnetic Core Inductor with Vertical Laminations," which is hereby incorporated by reference.

TECHNICAL FIELD

The present application is directed to methods of manufacturing inductors formed in multiple-layer devices for use in applications such as microelectronics.

BACKGROUND

The increase in computing power, spatial densities in semiconductor-based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency. Most efforts to improve the energy efficiency of microelectronic devices has been at the chip and transistor level, including with respect to transistor gate width. However, these methods are limited and other approaches are necessary to increase device density and processing power and to reduce power consumption and heat generation.

One field that can benefit from the above improvements is in switched inductor power conversion devices. These devices can be challenging because power loss increases with higher currents, pursuant to Ohm's law: $P_{loss}=I^2R$, where $P_{loss}$ is the power loss over the length of wire and circuit trace, I is the current and R is the inherent resistance over the length of wire and circuit trace. As such, and to increase overall performance, there has been a recognized need in the art for large scale integration of compact and dense electrical components at the chip level, such as for use with the fabrication of complementary metal oxide semiconductors (CMOS).

With the development of highly integrated electronic systems that consume large amounts of electricity in very small areas, the need arises for new technologies which enable improved energy efficiency and power management for future integrated systems. Integrated power conversion is a promising potential solution as power can be delivered to integrated circuits at higher voltage levels and lower current levels. That is, integrated power conversion allows for step-down voltage converters to be disposed in close proximity to transistor elements.

Unfortunately, practical integrated inductors that are capable of efficiently carrying large current levels for switched-inductor power conversion are not available. Specifically, inductors that are characterized by high inductance (e.g., greater than 1 nH), low resistance (e.g., less than 1 ohm), high maximum current rating (e.g., greater than 100 mA), and high frequency response whereby there is little or no inductance decrease for alternating current (AC) input signal up to 10 MHz are unavailable or impractical using present technologies.

Furthermore, all of these properties must be economically achieved in a small area, typically less than 1 $mm^2$, a form required for CMOS integration either monolithically or by 3D or 2.5D chip stacking. Thus, an inductor with the aforementioned properties is necessary in order to implement integrated power conversion with high energy efficiency and low inductor current ripple which engenders periodic noise in the output voltage of the converter, termed output voltage ripple.

Accordingly, there is a need for high quality inductors to be used in large scale CMOS integration, to provide a platform for the advancement of systems comprising highly granular dynamic voltage and frequency scaling as well as augmented energy efficiency.

The use of high permeability, low coercivity material is typically required to achieve the desired inductor properties on a small scale. In electromagnetism, permeability is the measure of the ability of a material to support the formation of a magnetic field within itself. In other words, it is the degree of magnetization that a material obtains in response to an applied magnetic field. A high permeability denotes a material achieving a high level of magnetization for a small applied magnetic field.

Coercivity, also called the coercive field or force, is a measure of a ferromagnetic or ferroelectric material's ability to withstand an external magnetic or electric field, respectively. Coercivity is the measure of hysteresis observed in the relationship between applied magnetic field and magnetization. The coercivity is defined as the applied magnetic field strength necessary to reduce the magnetization to zero after the magnetization of the sample has reached saturation. Thus coercivity measures the resistance of a ferromagnetic material to becoming demagnetized. Ferromagnetic materials with high coercivity are called magnetically hard materials, and are used to make permanent magnets. Ferromagnetic materials that exhibit a high permeability and low coercivity are called magnetically soft materials, and are often used to enhance the inductance of inductors.

Coercivity is determined by measuring the width of the hysteresis loop observed in the relationship between applied magnetic field and magnetization. Hysteresis is the dependence of a system not only on its current environment but also on its past environment. This dependence arises because the system can be in more than one internal state. When an external magnetic field is applied to a ferromagnet such as iron, the atomic dipoles align themselves with it. Even when the field is removed, part of the alignment will be retained: the material has become magnetized. Once magnetized, the magnet will stay magnetized indefinitely. To demagnetize it requires heat or a magnetic field in the opposite direction.

High quality inductors are typically made from high permeability, low coercivity material. However, high permeability materials tend to saturate when biased by a large direct current (DC) magnetic field. Magnetic saturation can have adverse effects as it results in reduced permeability and consequently reduced inductance.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

An aspect of the invention is directed to a method of manufacturing an inductor comprising a laminated ferromagnetic core, comprising depositing a conductive seed layer on a planar surface on a substrate; depositing a masking insulator layer on the conductive seed layer and defining a pattern in the masking insulator layer, via photolithography or a subtractive wet or dry etch, to form exposed portions of the conductive seed layer between adjacent patterned portions of the masking insulator layer; depositing a plurality of ferromagnetic layers on the exposed portions of the conductive seed layer, each said ferromagnetic layer disposed on one of said exposed portions of the conductive seed layer and having a height extending from the conductive seed layer along a first axis, said first axis orthogonal to the planar surface; forming said laminated ferromagnetic core wherein the ferromagnetic layers and the insulator layers comprise alternating layers; and forming a conductive winding around the laminated ferromagnetic core.

In some embodiments, the ferromagnetic layers are deposited by electrodeposition. In some embodiments, the method further comprises applying a magnetic field during the electrodeposition of the ferromagnetic layers, the magnetic field being aligned with the height of each ferromagnetic layer, to permanently induce an easy axis of magnetization in each ferromagnetic layer, said easy axis of magnetization parallel to said first axis. In some embodiments, the method further comprises permanently inducing a hard axis of magnetization in each ferromagnetic layer, said hard axis of magnetization lying in a plane that is orthogonal to said first axis.

Another aspect of the invention is directed to manufacturing an inductor comprising a laminated ferromagnetic core. The method comprises depositing a conductive seed layer on a planar surface on a substrate; depositing a masking insulator layer on the conductive seed layer to form a layered structure comprising the substrate, the planar surface, the masking insulator layer, and the conductive seed layer; defining a pattern in the masking insulator layer, the pattern located in a first region of the layered structure, the first region corresponding to the laminated ferromagnetic core; forming voids in the masking insulator layer according to the pattern, the voids extending to the conductive seed layer to form exposed portions of the conductive seed layer; electrodepositing a ferromagnetic material on the exposed portions of the conductive seed layer to form columns of the ferromagnetic material, wherein the masking insulator layer and the columns of the ferromagnetic material in the first region comprise alternating layers of the laminated ferromagnetic core; and forming a conductive winding around the laminated ferromagnetic core.

In some embodiments, the method further comprises removing the masking insulator layer and the underlying conductive seed layer from a second region of the layered structure to expose the planar surface on the substrate, the second region corresponding to a region outside of the ferromagnetic core; and depositing a passivation layer on the first and second regions of the layered structure, such that the passivation layer is disposed on the laminated ferromagnetic core in the first region and the passivation layer is disposed on the planar surface in the second region. In some embodiments, the method further comprises applying a magnetic field during the electrodepositing step, the magnetic field aligned with a height of each column of the ferromagnetic material, said height extending from the conductive seed layer along a first axis, said first axis orthogonal to the planar surface. In some embodiments, the magnetic field induces (a) a permanent easy axis of magnetization parallel to said first axis in the ferromagnetic material and (b) a permanent hard axis of magnetization in the ferromagnetic material, said hard axis of magnetization lying in a plane that is orthogonal to said first axis. In some embodiments, the masking insulator layer comprises a photoimageable polymer. In some embodiments, the pattern is defined by selectively exposing portions of the photoimageable polymer to light using photolithography, resulting in exposed portions and unexposed portions of the photoimageable polymer in the first region of the layered structure. In some embodiments, the voids are formed by removing the unexposed portions of the photoimageable polymer using a solvent. In some embodiments, the masking insulator material comprises at least one of silicon dioxide, $Si_xN_y$, or a polymer. In some embodiments, the pattern is defined by a subtractive wet or dry etch.

Another aspect of the invention is directed to a method of manufacturing an inductor comprising a laminated ferromagnetic core, comprising: depositing a conductive seed layer on a planar surface on a substrate; depositing a masking layer on the conductive seed layer to form a layered structure comprising the substrate, the planar surface, the masking layer, and the conductive seed layer; defining a pattern in the masking layer, the pattern located in a first region of the layered structure, the first region corresponding to the laminated ferromagnetic core; forming voids in the masking layer according to the pattern, the voids extending to the conductive seed layer to form exposed portions of the conductive seed layer; electrodepositing a first ferromagnetic material on the exposed portions of the conductive seed layer to form columns of the first ferromagnetic material; removing the masking material from the first region of the layered structure to form gaps between adjacent columns of the first ferromagnetic material, the gaps exposing the conductive seed layer; forming an oxide film layer on each opposing sidewall of each column of the first ferromagnetic material, the oxide film layer comprising an oxide of said first ferromagnetic material; electrodepositing a second ferromagnetic material on the conductive seed layer in each gap between adjacent columns of the first ferromagnetic material to form columns of the second ferromagnetic material, the oxide film disposed between each column of the first ferromagnetic material and each column of the second ferromagnetic material, wherein the laminated ferromagnetic core comprises the columns of the first ferromagnetic material, the columns of the second ferromagnetic material, and the oxide film layers; and forming a conductive winding around the laminated ferromagnetic core.

In some embodiments, the oxide film layers are formed by heating the columns of the first ferromagnetic material to a temperature of about 100° C. to about 500° C. following the removal of the masking material. In some embodiments, the method further comprises applying a first magnetic field during the electrodepositing of the first ferromagnetic material, the first magnetic field aligned with a height of each column of the first ferromagnetic material, said height extending from the conductive seed layer along a first axis, said first axis orthogonal to the planar surface. In some embodiments, the first magnetic field induces (a) a permanent easy axis of magnetization parallel to said first axis in the first ferromagnetic material and (b) a permanent hard axis of magnetization in the first ferromagnetic material, said permanent hard axis of magnetization lying in a plane that is orthogonal to said first axis. In some embodiments, the method further comprises applying a second magnetic field during the electrodepositing of the second ferromagnetic material, the second magnetic field aligned with a height of each column of the second ferromagnetic material, said height extending from the conductive seed layer along said first axis. In some embodiments, the second magnetic field induces (a) a permanent easy axis of magnetization parallel to said first axis in the second ferromagnetic material and (b) a permanent hard axis of magnetization, parallel to said hard axis of magnetization in the first ferromagnetic material, in the second ferromagnetic material.

BRIEF DESCRIPTION OF THE DRAWINGS

For a fuller understanding of the nature and advantages of the present invention, reference is made to the following detailed description of preferred embodiments and in connection with the accompanying drawings, in which:

FIGS. 4A and 4B illustrate a cross-sectional view and a top view, respectively, of a first structure formed during the process for fabricating an inductor according to FIG. 3;

FIGS. 6A and 6B illustrate a cross-sectional view and a top view, respectively, of a third structure formed during the process for fabricating an inductor according to FIG. 3;

FIGS. 7A and 7B illustrate a cross-sectional view and a top view, respectively, of a fourth structure formed during the process for fabricating an inductor according to FIG. 3;

FIGS. 10A and 10B illustrate a cross-sectional view and a top view, respectively, of a first structure formed during the second portion of the process for fabricating an inductor according to FIG. 9;

FIGS. 11A and 11B illustrate a cross-sectional view and a top view, respectively, of a second structure formed during the second portion of the process for fabricating an inductor according to FIG. 9;

FIGS. 13A and 13B illustrate a cross-sectional view and a top view, respectively, of a first structure formed during the second portion of the process for fabricating an inductor according to FIG. 12;

FIGS. 15A and 15B illustrate a cross-sectional view and a top view, respectively, of a third structure formed during the second portion of the process for fabricating an inductor according to FIG. 12;

FIGS. 16A and 16B illustrate a cross-sectional view and a top view, respectively, of a fourth structure formed during the second portion of the process for fabricating an inductor according to FIG. 12;

FIGS. 17A and 17B illustrate a cross-sectional view and a top view, respectively, of a fifth structure formed during the second portion of the process for fabricating an inductor according to FIG. 12;

FIGS. 18A and 18B illustrate a cross-sectional view and a top view, respectively, of a sixth structure formed during the second portion of the process for fabricating an inductor according to FIG. 12;

FIG. 19 is a side view of an apparatus for electrodepositing ferromagnetic material in the presence of a magnetic field according to one or more embodiments;

DETAILED DESCRIPTION

Figure 1:
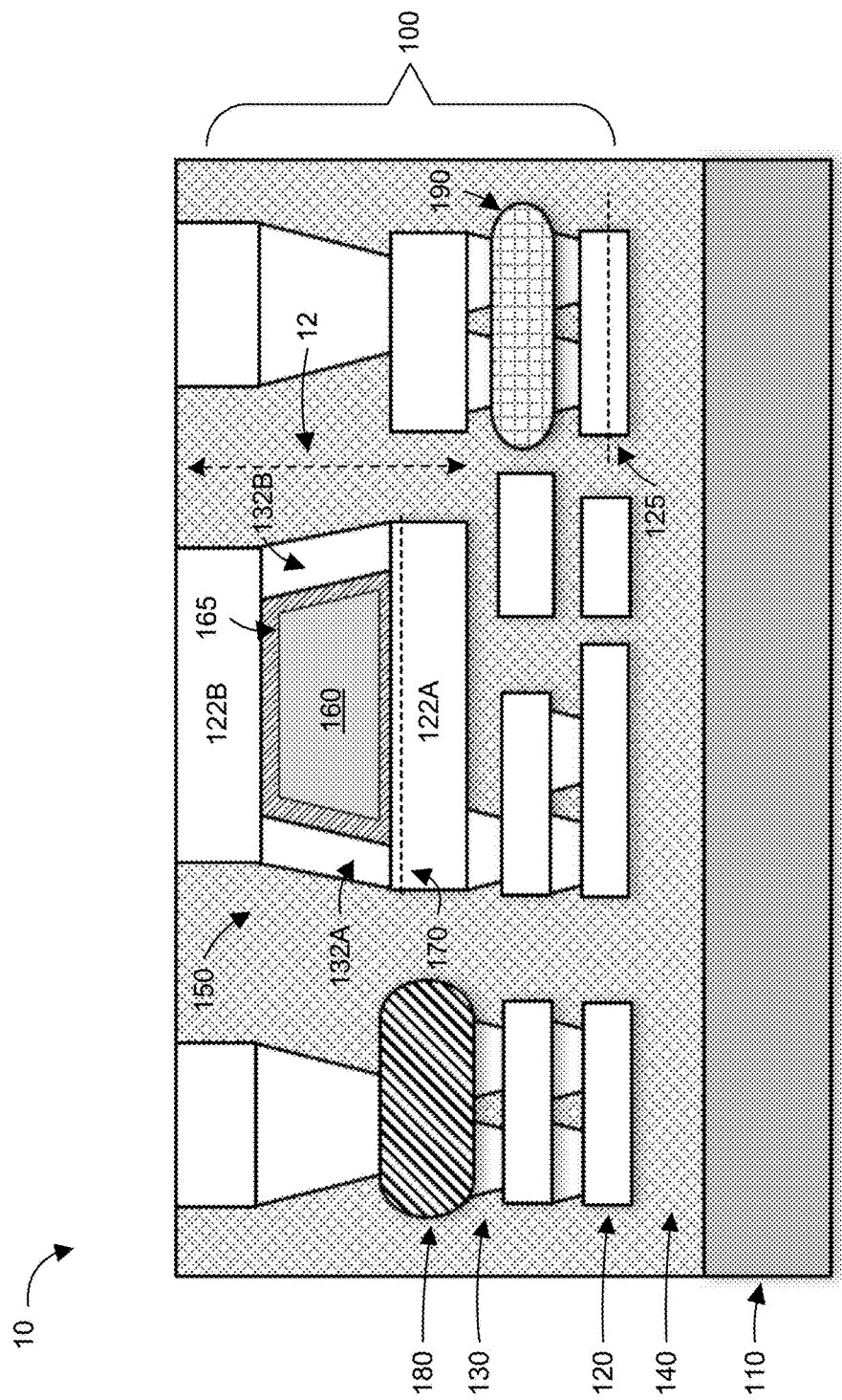
FIG. 1 is a cross-sectional view of a device having an inductor integrated into a multilevel wiring structure according to one or more embodiments.

FIG. 1 illustrates a cross-sectional view of a device 10 having an inductor integrated into a multilevel wiring structure according to one or more embodiments. Device 10 comprises a multilevel wiring structure 100 disposed on a substrate 110. Multilevel wiring structure 100 includes metal wiring levels 120 and vertical conductive interconnects or VIAs 130. Metal wiring levels 120 and VIAs 130 are constructed out of a conductive material, such as copper and/or aluminum. Metal wiring levels 120 and VIAs 130 can include additional layers such as titanium, titanium nitride, tantalum, tantalum nitride, and/or other layers. It is noted that multilevel wiring structure 100 can include additional or fewer metal wiring levels 120 and/or VIAs 130. The spaces in the wiring structure 100 are filled with a dielectric insulating material 140, such as silicon dioxide, silicon nitride, polyimide or epoxy.

A thin film magnetic inductor 150 is integrated into at least a portion of multilevel wiring structure 100. The inductor 150 includes a single planar magnetic core 160. The core plane 170 of the planar magnetic core 160 is substantially parallel with the planes (e.g., plane 125) defining each metal layer 120. The conductive winding or coil of the inductor 150, forming a general spiral on the outside of the planar magnetic core 160, is piecewise constructed of wire segments 122A, 122B and of VIAs 132A, 132B. The wire segments 122A, 122B forming the winding pertain to at least two of the metal wiring levels 120 and the VIAs 132A, 132B that form the parts of the windings that are orthogonal to the principal plane 170 are interconnecting the at least two wiring metal wiring levels 120. An insulator 165, such as silicon dioxide, silicon nitride, polyimide, and/or epoxy, is disposed around the core 160.

In some embodiments, inductor 150 has a small height 12, such as less than about 50 microns. The small height 12 provides a low profile for inductor 150, allowing it to be integrated into device 10 in various locations and/or configurations. A representative thickness or height (i.e., along the axis orthogonal to the plane of the substrate 110) of wire segments 122A/122B is about 1 µm to about 20 µm, about 5 µm to about 15 µm, about 10 µm, or any value or range between any two of the foregoing thicknesses. A representative thickness of magnetic core 160 is about 1 µm to about 20 µm, about 5 µm to about 15 µm, about 10 µm, or any value or range between any two of the foregoing thicknesses. Therefore, a representative thickness or height of VIAs 132A/132B is slightly larger than about 1 µm to about 20 µm, such as about 2 µm to about 22 µm or any value or range of the sum of the thickness of wire segments 122A/122B and core 160. The VIAs 132A/132B can also have a thickness greater than about 20 µm up to an including about 40 µm, such as about 22 µm, 25 µm, about 30 µm, about 35 µm, or any value or range between any two of the foregoing thicknesses. A representative thickness of insulator layer 165 is about 1 nm to about 10,000 nm, including about 500 nm to about 1,000 nm, about 2,500 nm, about 5,000 nm, about 7,500 nm, or any value or range between any two of the foregoing thicknesses. As used herein, "about" means plus or minus 10% of the relevant value.

The substrate 110 can include silicon, silicon dioxide, silicon nitride, a layered silicon-insulator structure (e.g., silicon on insulator or SOI), silicon germanium, or a III-V structure such as aluminum gallium arsenide.

Device 10 can also include optional components shown as representative structures 180, 190, which can include one or more capacitors (e.g., trench capacitors, MIM capacitors, etc.), resistors, transformers, diodes, and/or inductors. Such components, including inductor 150, can be electrically coupled in series, in parallel, or a combination thereof, to one another. For example, an inductor in the device 10, such as inductor 150, can form a portion of a switched inductor power converter circuit. In another example, Device 10 can include one or more capacitors that form a resonant impedance matching circuit, which, in combination with an inductor (e.g., inductor 150) and/or a transformer can provide impedance transformation at a particular frequency band. In another example, the components of device 10 form an electromagnetic interference (EMI) filter. In another example, the components of device 10 form a balun. In another example, the components of device 10 form at least one of a transformer, an antenna, or a magnetometer (e.g., a magnetic sensor). Of course, the device 10 can include two or more of the structures or features described above (e.g., a portion of a switched inductor power converter circuit and a balun). In addition or in the alternative, device 10 can include one or more active elements (e.g., transistors) that form an integrated circuit.

Figure 2:
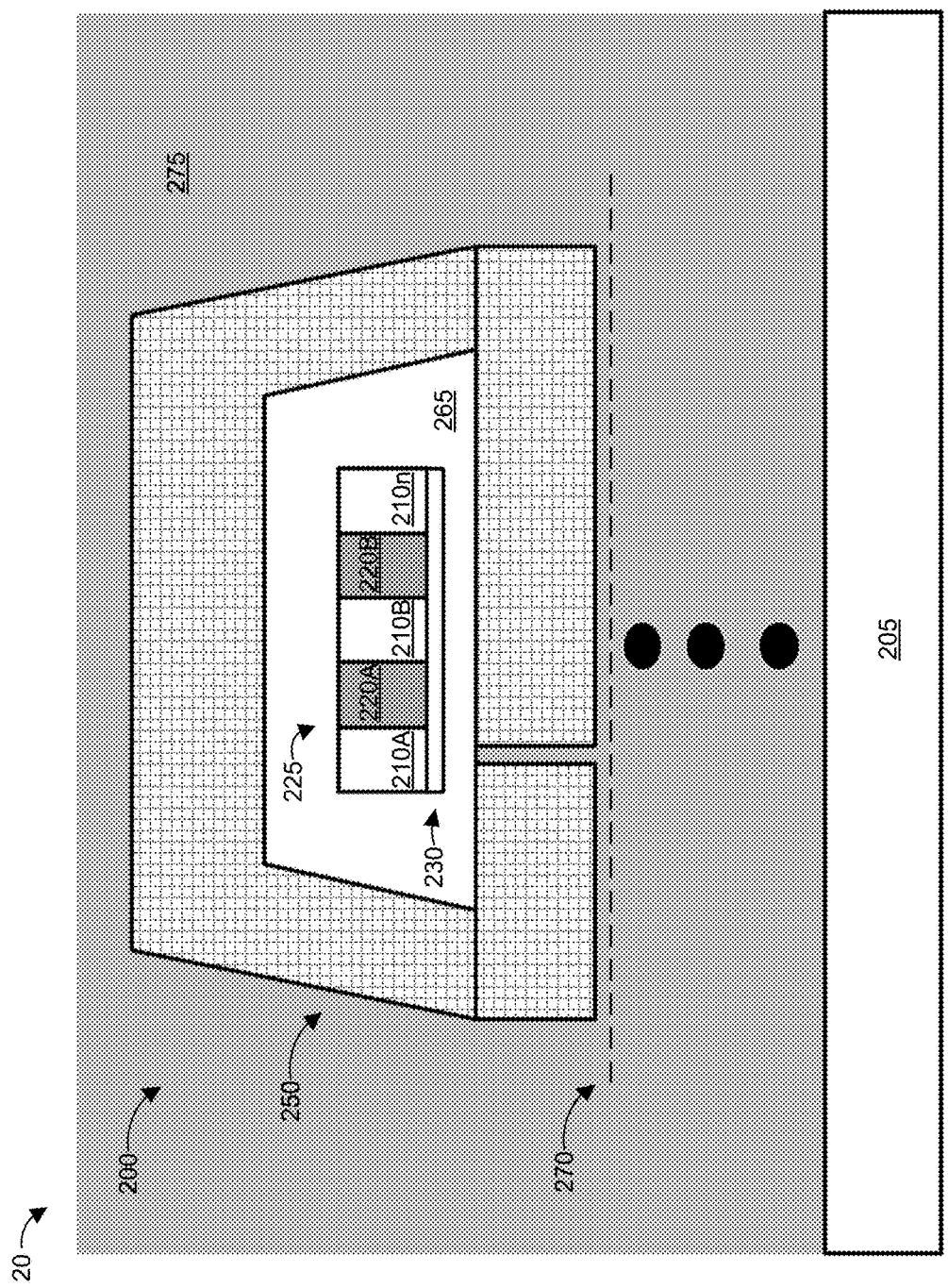
FIG. 2 is a detailed view of the inductor of FIG. 1 according to one or more embodiments.

FIG. 2 is a cross-sectional view of an inductor integrated into a multilevel wiring structure of a device 20 according to one or more embodiments. The device 20 includes a thin-film magnetic inductor 200 having a magnetic core 225 and an inductor coil 250. As discussed above a core insulator 265, such as silicon dioxide, silicon nitride, polyimide, or epoxy is disposed around at least a portion of the core 225. The inductor 200 is disposed on a core plane 270.

The magnetic core 225 includes a plurality of ferromagnetic layers 210A, 210B, 210n (in general, 210) disposed on a first planar surface 230. The ferromagnetic layers 210 have a high aspect ratio of about 1 to about 20,000, including about 2,500, about 5,000, about 7,500, or any value or range between any two of the foregoing values. The ferromagnetic layers 210 can be formed by electrodeposition. The ferromagnetic layers 210 can comprise Co, Ni, and/or Fe, such as $Ni_xFe_y$ or $Co_xN_yFe_z$. In addition, or in the alternative, ferromagnetic layers 210 can comprise an alloy of Co, Ni, and/or Fe and their respective oxides, such as $Co_xO_y$, $Ni_xO_y$ and/or $Fe_xO_y$. As discussed herein, the ferromagnetic layers 210 can have an easy axis of magnetization and a hard axis of magnetization permanently or semi-permanently induced by application of an external magnetic field. The first planar surface 230 can be an electrically conductive seed layer, as described in further detail herein.

The magnetic core 225 also includes a plurality of insulator layers 220A, 220B, 220n (in general, 220) disposed on the first planar surface 230. Each insulator layer 220 is disposed between adjacent ferromagnetic layers 210. For example, insulator layer 220A is disposed between ferromagnetic layers 210A and 210B. The alternating ferromagnetic layers 210 and insulator layers 220 form a vertically-laminated core structure with respect to the core plane 270 and the substrate 205. The insulator layers 220 can comprise an oxide of the ferromagnetic layer 210 (e.g., an oxide of Fe if the ferromagnetic layer 210 includes Fe). In some embodiments, the oxide of the ferromagnetic layer can be formed by processing the ferromagnetic layer, during or after deposition, in an oxygen-rich environment. The insulator layers 220 can also comprise silicon dioxide, $Si_xN_y$ (e.g., silicon nitride), polyimide, epoxy, and/or other known insulator materials that are suitable for semiconductor manufacturing. The insulator layers 220 can also be a portion of a sacrificial masking material that was used to define the vertical ferromagnetic layers 210, as discussed herein.

The inductor coil 250 is wrapped around the core 225 in a generally spiral manner along a central axis. The magnetic field generated by the inductor coil 250 travels through the core 225 as it passes into or out of the page, depending on the direction of winding of the core 225, parallel to the central axis. Inductor coil 250 can be formed out of VIAs and planar wire segments, as discussed above with respect to FIG. 1.

Figure 3:
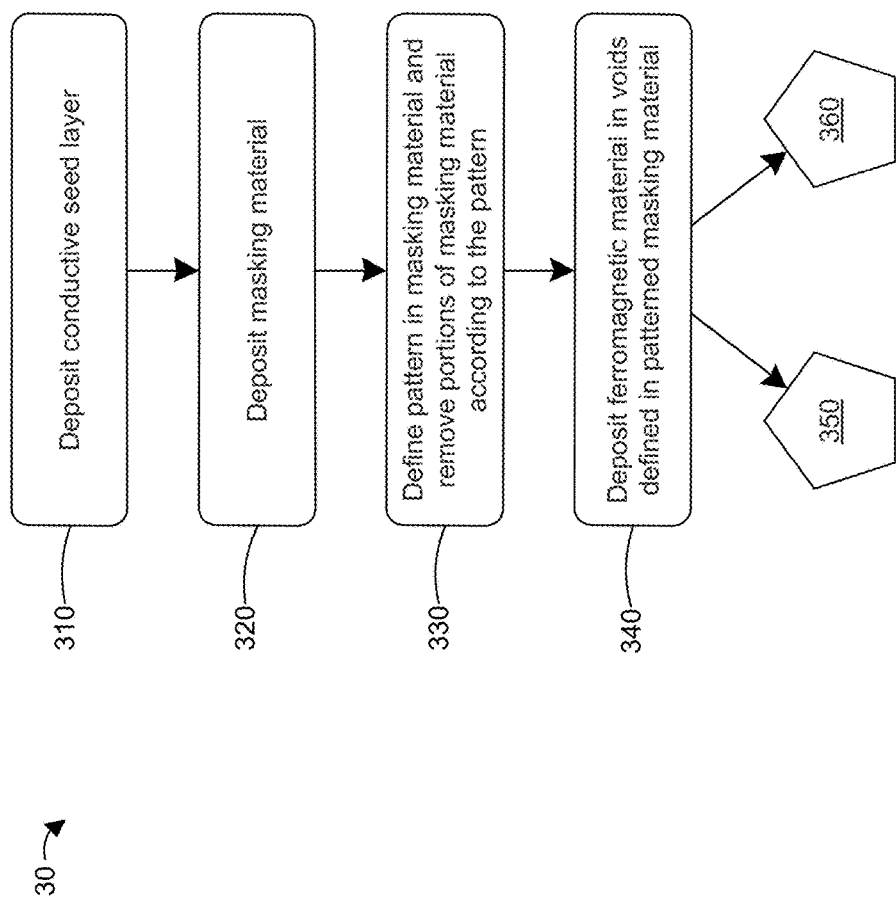
FIG. 3 is a flowchart of a process for fabricating an inductor having vertically-oriented ferromagnetic laminations according to one or more embodiments.

FIG. 3 is a flowchart 30 of a process for fabricating an inductor having vertically-oriented ferromagnetic laminations according to one or more embodiments. In step 310, a conductive seed layer is deposited (e.g., by a plasma vapor deposition process, such as physical vapor deposition (PVD), ionized physical vapor deposition (iPVD), self-ionized physical vapor deposition (e.g., SIP™, available from Applied Materials, Inc.), etc.) on a planar surface (or substantially planar surface) on a substrate. In some embodiments, the planar surface on which the conductive seed layer is deposited can be the exposed surface of the substrate (e.g., a semiconductor material such as silicon). Alternatively, the conductive seed layer can be deposited on a planar or a substantially planar surface formed by at least a portion of a layer of a multilevel wiring structure. The conductive seed layer can include copper, aluminum, cobalt or other electrically-conductive material, or a combination of two or more of the foregoing. The seed layer can have a thickness of about 1 to about 200 nm, about 50 nm, about 10 nm, about 150 nm, or any value or range between any two of the foregoing values. In some embodiments, the seed layer material is selected so that minimal or no oxide is formed on the seed layer during subsequent processing (e.g., in step 1220 below); an example of such seed layer material is gold and/or platinum.

FIGS. 4A and 4B illustrate a cross-sectional view and a top view, respectively, of the structure 40 formed in step 310. The structure 40 includes conductive seed layer 410 disposed on substrate 400. As discussed, in some embodiments conductive seed layer 410 is disposed on a planar surface, such as an exposed portion of a multilevel wiring structure, that itself is disposed on the substrate 400.

In step 320, a masking material is deposited on the seed layer. The masking material can be in direct physical contact with the seed layer. The masking material can be photoimageable (e.g., a photoimageable polymer such as photoresist) such that a pattern can be defined in the material through photolithography. Alternatively, the masking material can be an insulator (e.g., silicon dioxide, a silicon nitride ($Si_xN_y$), and/or a polymer such as a photoresist, etc.) that can be etched in a pattern through photolithography and a subtractive wet or dry etch. The masking material can be deposited through a spin-on process typical of photolithography or through a chemical vapor deposition (CVD) process typically used to realize a $Si_xN_y$ layer.

Figure 5A:
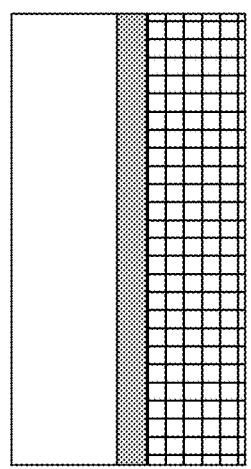
FIGS. 5A and 5B illustrate a cross-sectional view and a top view, respectively, of a second structure formed during the process for fabricating an inductor according to FIG. 3.
Figure 5B:
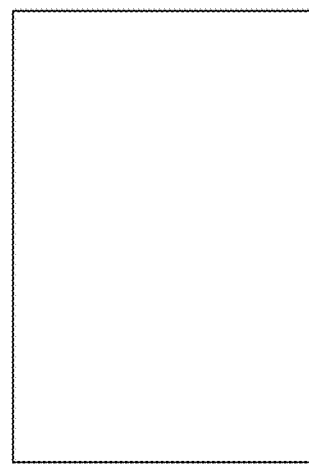

FIGS. 5A and 5B illustrate a cross-sectional view and a top view, respectively, of the structure 50 formed in step 320. The structure 50 includes masking material 420 disposed on conductive seed layer 410, which is disposed directly or indirectly on substrate 400.

Figure 22A:
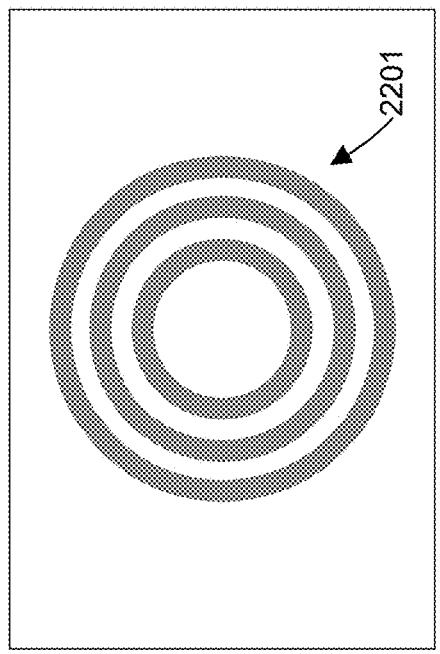
FIGS. 22A, 22B, and 22C are top views of various patterns in a masking material for electrodepositing vertically-laminated ferromagnetic material according to one or more embodiments.
Figure 22B:
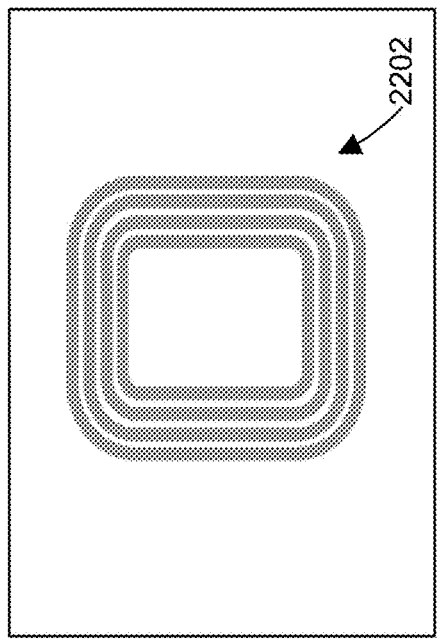
Figure 22C:
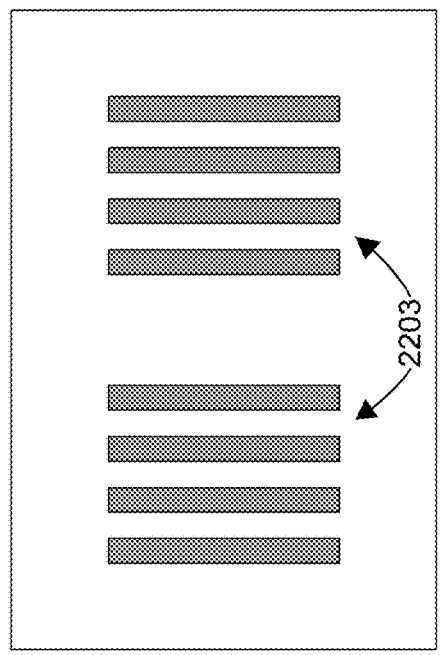

In step 330, a pattern is defined in the masking material in the region of the core. The pattern can be formed by selectively exposing certain portions of the photoimageable masking material to light using photolithography and a mask corresponding to the desired pattern. Examples of patterns that can be formed in the masking material are illustrated in FIGS. 22A-C. Exposing certain portions of the masking material to light (e.g., UV light) causes those portions of the masking material to crosslink. Following the crosslinking process, the non-crosslinked portions of the masking material can be removed, for example by dissolving them in a solvent that only removes non-crosslinked portions through chemical reactions. The solvent does not remove the crosslinked portions of the masking material. Alternatively, if the masking material is an insulator, such as silicon dioxide or silicon nitride, the masking material can be patterned using photolithography and a subtractive wet or dry etch.

FIGS. 6A and 6B illustrate a cross-sectional view and a top view, respectively, of the structure 60 formed in step 330. The structure 60 includes masking material 420 in which a pattern has been formed in the region 450 of the core. The pattern includes regions 430 of masking material 420 that are crosslinked as a result of light exposure during photolithography and regions 440 of masking material 420 that were not exposed to light and the masking material 420 was subsequently removed. By removing masking material 420 from regions 440, the conductive seed layer 410 is exposed in regions 440. Regions 422 and 424 are exposed to light and therefore crosslinked, and can be later removed in a solvent that removes only crosslinked portions through chemical reactions.

In step 340, a ferromagnetic material is deposited in the regions 440 of removed masking material 420. The ferromagnetic material can be deposited by electroplating where the exposed conductive seed layer 410 in regions 440 provide a conductive pathway that allows for selective electrodeposition in those regions. The ferromagnetic material can include Co, Ni, and/or Fe, such as $Ni_xFe_y$ and/or $Co_xNi_yFe_z$. Since the conductive seed layer 410 is on the bottom surface of regions 440 and not on their sidewalls, the ferromagnetic material is deposited from the bottom up (starting at the exposed surface of conductive seed layer 410). This allows the ferromagnetic material to be deposited in patterned structures having high aspect ratios of about 1 to about 20,000, including about 2,500, about 5,000, about 7,500, or any value or range between any two of the foregoing values.

Figure 20:
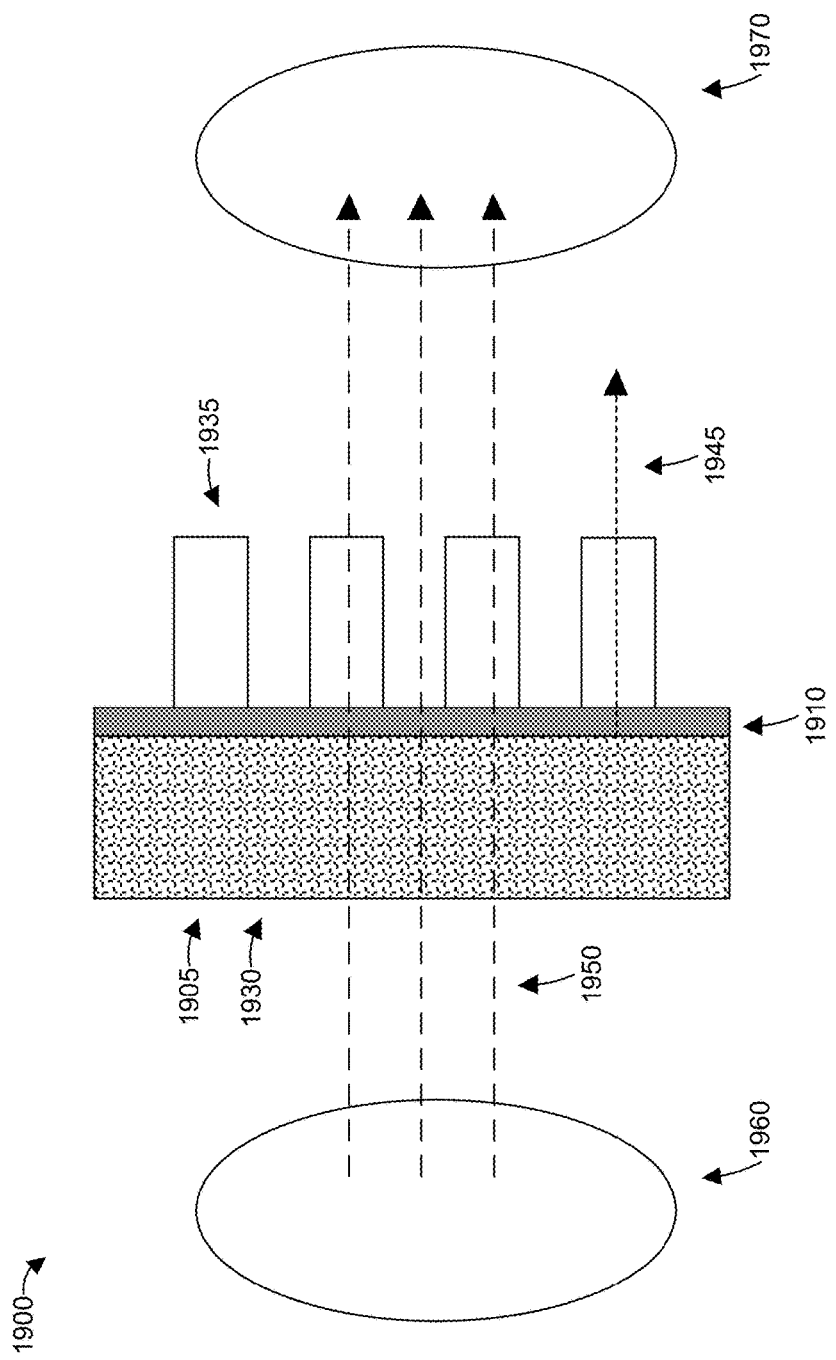
FIG. 20 is a detailed view of the orientation of the magnetic field with respect to the substrate and patterned columns or mesas of masking or insulator material.
Figure 21:
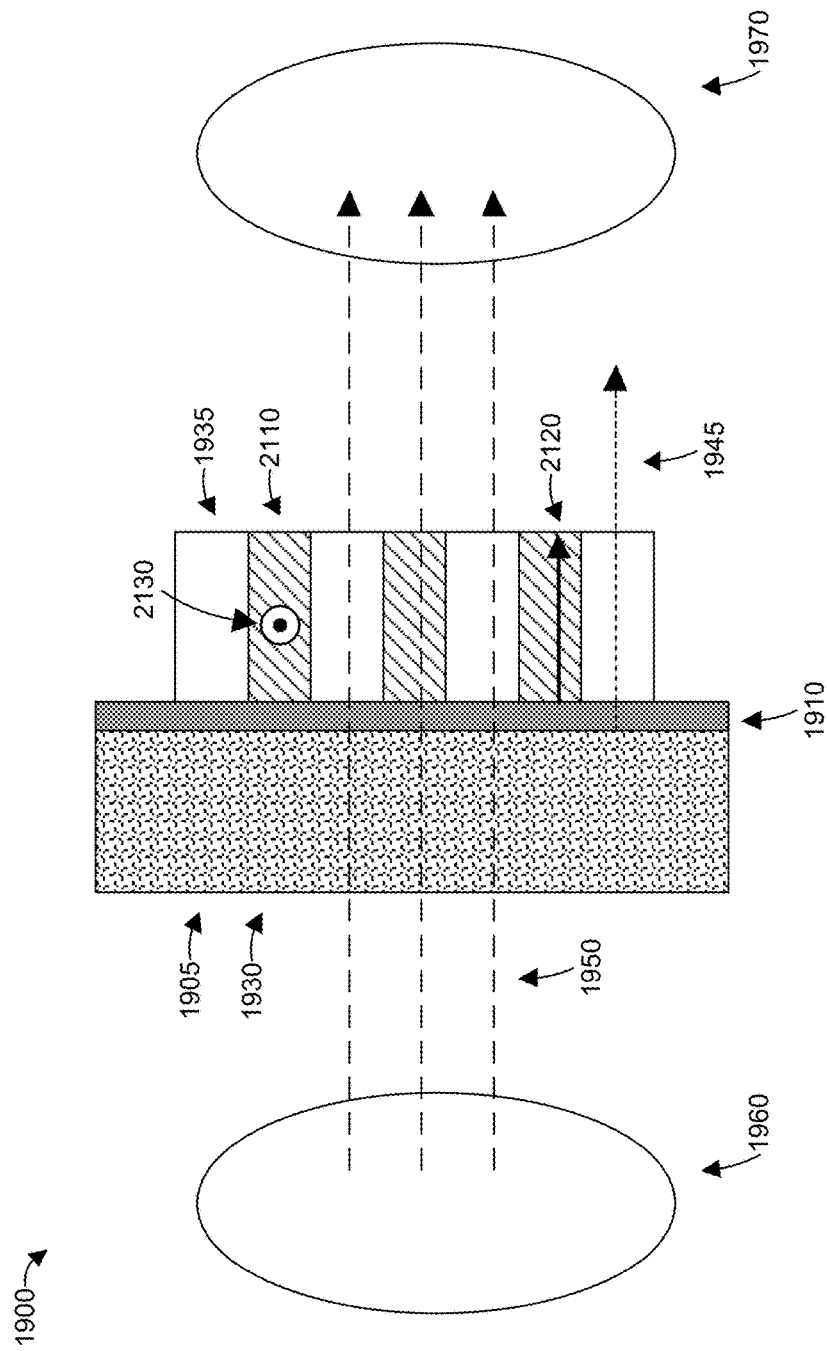
FIG. 21 is a detailed view of the orientation of the substrate after ferromagnetic material has been electrodeposited as vertical laminations between patterned columns of insulator material in the presence of a magnetic field.

In some embodiments, the ferromagnetic material is electrodeposited in the presence of an applied magnetic field that induces magnetic anisotropy in the deposited ferromagnetic material as further described herein. An example of an apparatus that can be used to electrodeposit ferromagnetic material in the presence of an applied magnetic field is illustrated in FIGS. 19-21. Alternatively, an external magnetic field can be applied while annealing the structure after fabrication of the inductor or core (e.g., following step 910, 920, or 930, or following step 1250, 1260, or 1270) to permanently or semi-permanently set the magnetic anisotropy of the core. For example, the external magnetic field can have a magnetic field strength that is considerably higher than the magnetic material's intrinsic saturation field (e.g., greater than or equal to about 30 Oe) while annealing the structure at a temperature greater than about 200° C., such as about 225° C., about 250° C., about 275° C., or about 300° C., for several hours. Many combinations of temperature, magnetic field strength and time may be effective at inducing the magnetic anisotropy. An example of such a magnetic anneal is described in U.S. patent application Ser. No. 14/746,994, titled "Apparatus and methods for Magnetic Core Inductors with Biased Permeability," filed on Jun. 23, 2015, which is hereby incorporated by reference.

Figure 8:
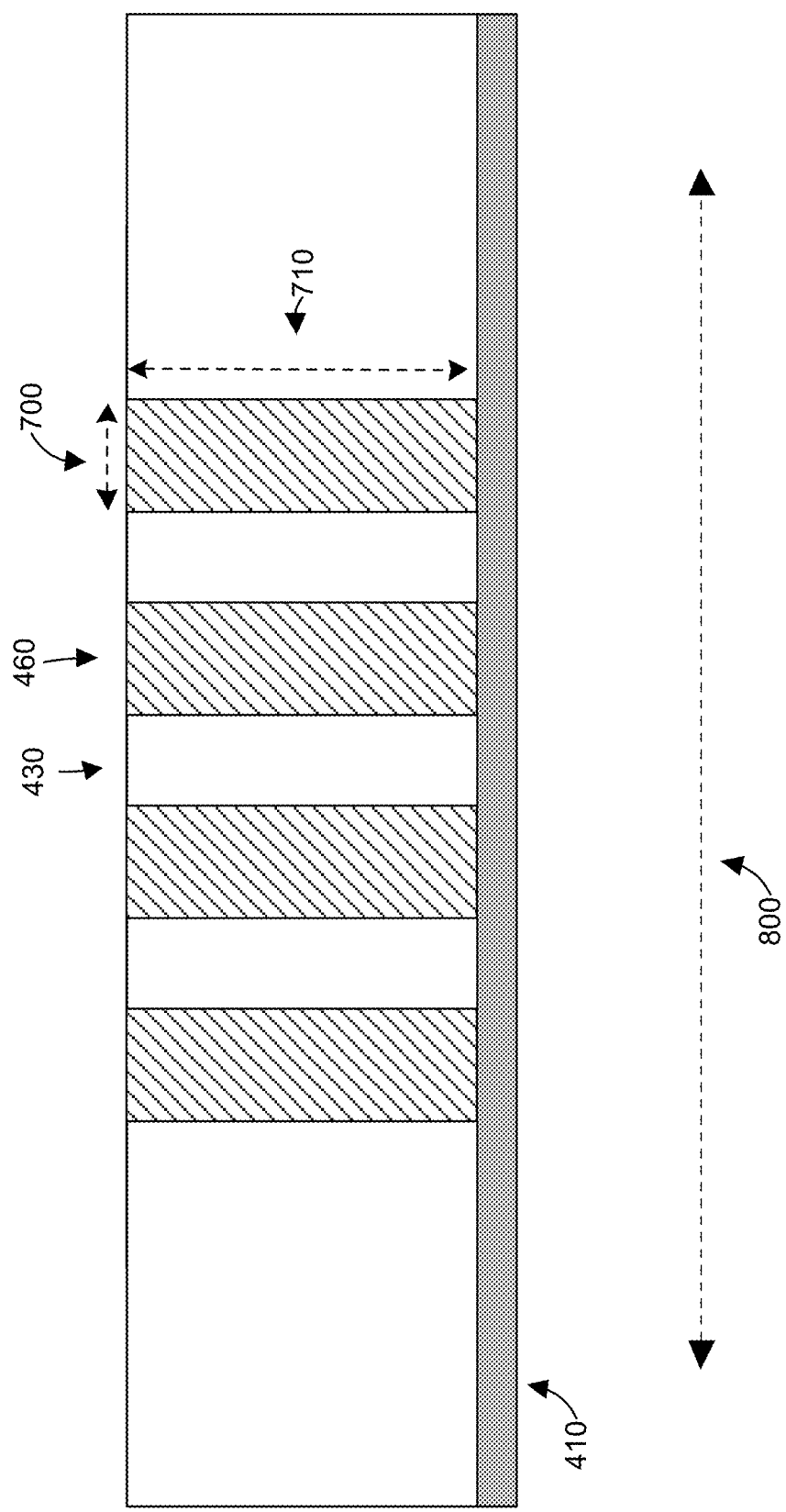
FIG. 8 is a detailed cross-sectional view of a portion of the fourth structure illustrated in FIGS. 7A and 7B.

FIGS. 7A and 7B illustrate a cross-sectional view and a top view, respectively, of the structure 70 formed in step 340. As illustrated, ferromagnetic material 460 is selectively electrodeposited on the exposed surfaces of conductive seed layer in regions 440 defined in core region 450. The ferromagnetic material 460 in regions 440 form a plurality of columns. Each column has a width 700 and a height 710, as illustrated in FIG. 8, which is a detailed cross-sectional view of the masking material 420 and ferromagnetic material 460, disposed on seed layer 410, shown in FIGS. 7A and 7B. The width 700 can be, in some embodiments, less than or equal to 5 microns, for example from about 5 nm to about 5 microns, including about 500 nm, about 1 micron, about 2 microns, about 3 microns, about 4 microns, or any value or range between any two of the foregoing values. In other embodiments, the width 700 is greater than 5 microns, such as from about 5 microns to about 10 microns including about 6 microns, about 7 microns, about 8 microns, about 9 microns, or any value or range between any two of the foregoing values. In some embodiments, a width 700 of about 5 nm to about 5 microns can substantially reduce, eliminate, and/or suppress eddy currents when the inductor operates in the AC frequency range 0 Hz to about 10 GHz, including about 2 GHz, about 4 GHz, about 6 GHz, about 8 GHz, or any value or range between any two of the foregoing values. The AC frequency range in which eddy currents are substantially reduced, eliminated, and/or suppressed can be a function of the width 700 of the vertical laminations and the electrical resistivity of the ferromagnetic material 460. The height 710 of each column (i.e., the electroplating thickness) can be about 10 microns to about 100 microns, including about 25 microns, about 50 microns, about 75 microns, or any value or range between any two of the foregoing values. The aspect ratio of the columns is calculated as the ratio of the height 710 to the width 700. Thus, the columns can have a high aspect ratio, such as an aspect ratio of about 1 to about 20,000, including about 2,500, about 5,000, about 7,500, or any value or range between any two of the foregoing values. Core plane 800 is illustrated in FIG. 8 for reference. Core plane 800 is orthogonal to the height 710 of the columns of ferromagnetic material 460. Core plane 800 is parallel to the width 700 of the columns of ferromagnetic material 460.

After step 340 in FIG. 3, the flow chart 30 proceeds to placeholders 350 and 360. Placeholder 350 corresponds to the fabrication processes when a photoimageable masking material is deposited in step 320. Placeholder 360 correspond to the fabrication processes when an insulator, such as silicon dioxide, $Si_xN_y$ (e.g., silicon nitride), and/or epoxy is deposited in step 320.

Figure 9:
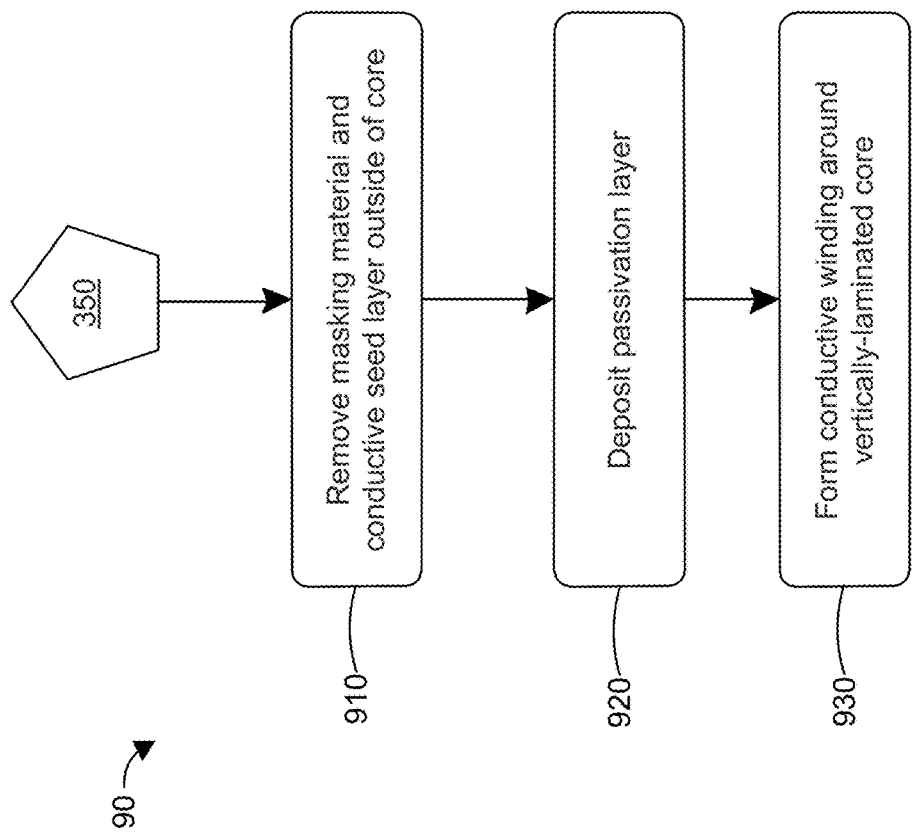
FIG. 9 is a flow chart of a second portion of a process for fabricating an inductor according to a first placeholder in FIG. 3.

FIG. 9 is a flow chart 90 that illustrates a fabrication process corresponding to placeholder 350 where a photoimageable masking material was deposited in step 320. Following the ferromagnetic material deposition (step 340 in FIG. 3), the masking material and the conductive seed layer in the regions (e.g., regions 422 and 424) outside of the core are removed in step 910. The masking material in the regions outside of the core can be removed by dissolving the crosslinked masking material in a solvent that removes the crosslinked portions through chemical reactions. Following removal of the masking material, the conductive seed layer can be removed by a subtractive wet or dry etch. Photolithography and photoresist can be used to prevent unintended etching of materials in the core region during mask removal.

FIGS. 10A and 10B illustrate a cross-sectional view and a top view, respectively, of the structure 1000 formed in step 910. Structure 1000 includes a core region 450 including alternating ferromagnetic material 450 columns and cured masking material 430 columns disposed on planar seed layer 410. The seed layer 410 and masking material 430 in regions 422 and 424 outside of core region 450 have been removed, as discussed above. A portion of the seed layer 410 may or may not be exposed on the perimeter of core region 450 proximal to the outermost ferromagnetic material 450 columns. The ferromagnetic material 450 columns and crosslinked masking material 430 columns form a vertically-laminated core.

Returning to FIG. 9, in step 920, a passivation layer is deposited on the structure formed as a result of step 910. The passivation layer can be an insulator material such as silicon dioxide, silicon nitride, polyimide or epoxy. The passivation layer can be deposited via CVD for materials such as silicon dioxide or silicon nitride or spun on for materials such as polyimide or epoxy. The passivation layer thickness is the thickness of the core region 450 plus an additional thickness to cover the top of core region 450 by about 1 micron to about 20 microns, or any value or range therebetween. In some embodiments, the passivation layer is the same as core insulator layer 265 described above. FIGS. 11A and 11B illustrate a cross-sectional view and a top view, respectively, of the structure 1100 formed in step 920. As illustrated, passivation layer 1110 is deposited on the vertically-laminated core, on the exposed seed layer 410, and on substrate 400 in the regions outside of core region 450.

In step 930 (FIG. 9), a conductive winding is formed around the vertically-laminated core. The conductive winding can be formed in a portion of a multilevel wiring structure as illustrated in FIG. 1. The conductive winding can be fabricated using known semiconductor processes, such as with physical vapor deposition and electrodeposition of conductive materials to form the wiring levels and VIAs. An example of a conductive winding formed in a multilevel wiring structure is described in U.S. patent application Ser. No. 13/609,391, titled "Magnetic Core Inductor Integrated with Multilevel Wiring Network," filed on Sep. 11, 2012, which is hereby incorporated by reference.

Figure 12:
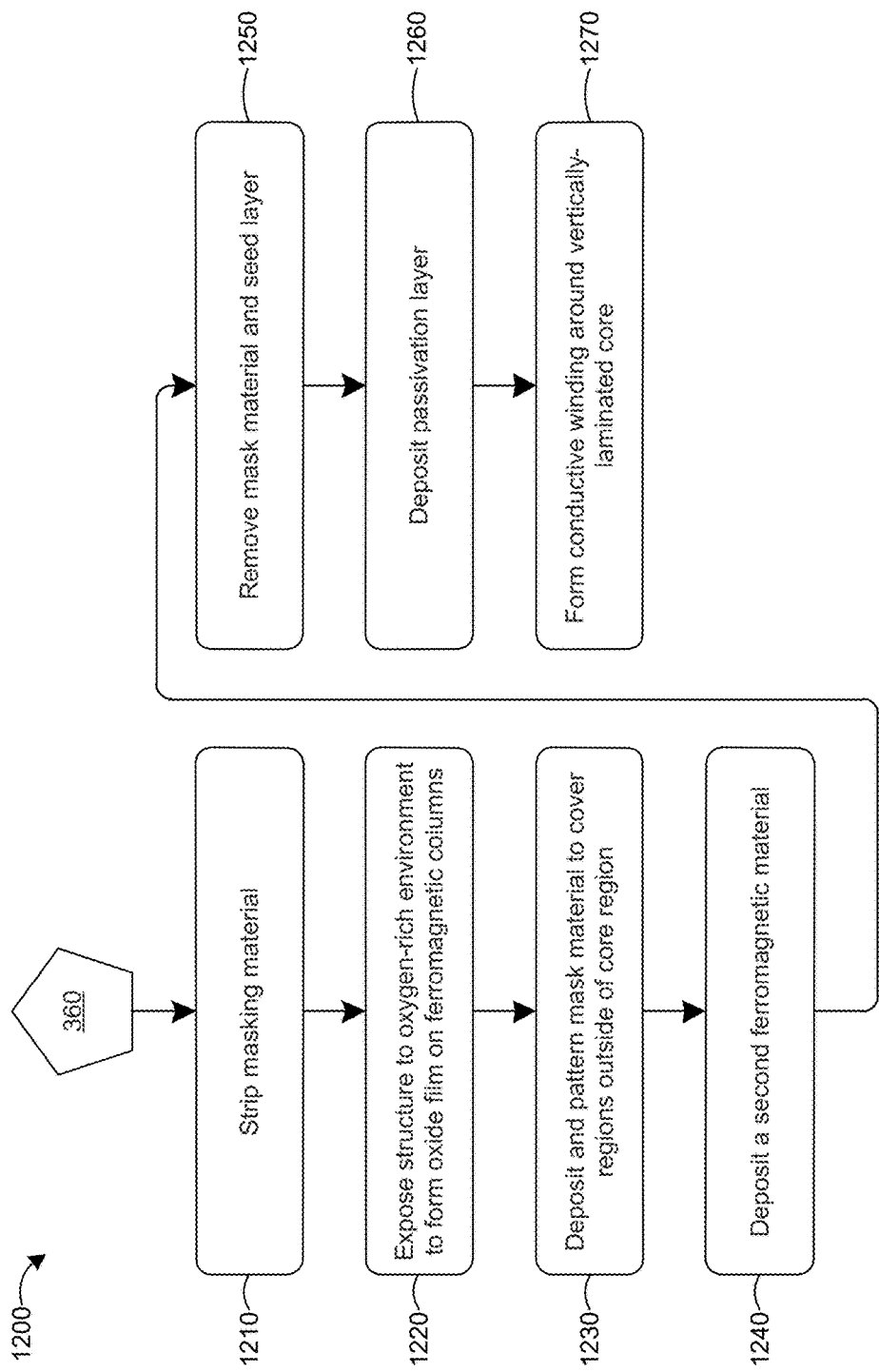
FIG. 12 is a flow chart of a second portion of a process for fabricating an inductor according to a second placeholder in FIG. 3.

FIG. 12 is a flow chart 1200 that illustrates a fabrication process corresponding to placeholder 360 where an insulator masking material was deposited in step 320. In step 1210, the remaining masking material is removed or stripped using a solvent that removes crosslinked portions of the masking material through chemical reactions. As a result of the removal or stripping process, the masking material disposed between the ferromagnetic columns is removed to exposed the sides of the ferromagnetic columns. In addition, the masking material in the regions outside of the core region is at least partially removed.

FIGS. 13A and 13B illustrate a cross-sectional view and a top view, respectively, of the structure 1200 formed in step 1210. As illustrated, the masking material has been removed from the region between ferromagnetic material 460 columns and from regions 422, 424 outside of core region 450. As a result of the removal of the masking material in the core region 450, voids or gaps 1310 are formed between adjacent ferromagnetic material 460 columns.

Figure 14A:
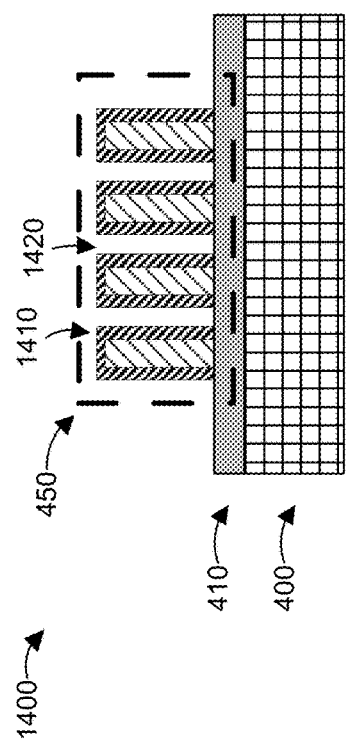
FIGS. 14A and 14B illustrate a cross-sectional view and a top view, respectively, of a second structure formed during the second portion of the process for fabricating an inductor according to FIG. 12.
Figure 14B:
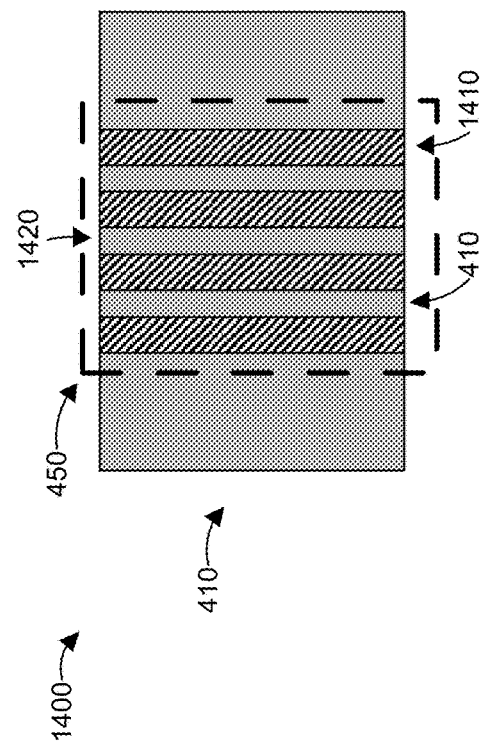

In step 1220, the structure formed as a result of step 1210 is exposed to an oxygen-rich environment, including an oxygen plasma environment and/or an oxygen gas environment, to selectively form an electrically insulating oxide film on the exposed surfaces of each ferromagnetic column. Step 1220 can include exposing the structure (e.g., in an anneal) to temperatures of about 100° C. to about 500° C., including any value or range therebetween. The oxygen-rich environment may also contain other gases such as argon and nitrogen and can be maintained in an oven, vacuum chamber or related system that provides a clean, easily-controlled environment. FIGS. 14A and 14B illustrate a cross-sectional view and a top view, respectively, of the structure 1400 formed in step 1220. As illustrated, an electrically insulating oxide film 1410 is formed on the exposed surfaces of the ferromagnetic material 420 columns (top and sides of columns in FIG. 14A). A second void region 1420 is disposed between the oxide film formed on the sides of adjacent ferromagnetic material 420 columns where the conductive seed layer 410 is exposed. The conductive seed layer 410 is also exposed in the regions outside of core region 450. The core region 450 is exposed to the oxygen-rich environment for a time and at a temperature conducive to forming an oxide film of thickness about 1 nm to about 30 nm, about 5 nm, about 10 nm, about 15 nm, about 20 nm, about 25 nm, or any value or range between any two of the foregoing values.

In step 1230, a second masking layer is deposited and patterned such that the second masking layer is disposed only in the regions outside of the core region. The second masking layer covers the seed layer in the regions outside of the core region so that only the conductive seed layer in the void regions 1420 are exposed. FIGS. 15A and 15B illustrate a cross-sectional view and a top view, respectively, of the structure 1500 formed in step 1230. As illustrated, the second masking layer deposited in regions 1510 and 1520 covers the seed layer 410 in the regions outside of core region 450. The seed layer 410 is exposed in void regions 1420, as illustrated in FIG. 15B.

In step 1240, a second ferromagnetic material is selectively electrodeposited on the exposed conductive seed layer in void regions 1420. The second ferromagnetic material can include the same (e.g., $Ni_xFe_y$ and/or $Co_xNi_yFe_z$) or different materials than the first ferromagnetic material deposited in step 340. In some embodiments, the ferromagnetic material is electrodeposited in the presence of an applied magnetic field that induces a permanent or semi-permanent magnetic anisotropy in the deposited ferromagnetic material as further described herein. Alternatively, an external magnetic field can be applied while annealing the structure after fabrication of the inductor or core (e.g., following step 1250, 1260, or 1270) to permanently or semi-permanently set the magnetic anisotropy of the core. For example, the external magnetic field can have a magnetic field strength that is considerably higher than the magnetic material's intrinsic saturation field (e.g., greater than or equal to about 30 Oe) while annealing the structure at a temperature greater than about 200° C., such as about 225° C., about 250° C., about 275° C., or about 300° C., for several hours. Many combinations of temperature, magnetic field strength and time may be effective at inducing and setting the magnetic anisotropy of the core.

FIGS. 16A and 16B illustrate a cross-sectional view and a top view, respectively, of the structure 1600 formed in step 1240. As illustrated, the second ferromagnetic material 1610 is deposited on the exposed conductive seed layer 410 in void regions 1420 (FIGS. 15A and 15B between adjacent oxide film layers 1410. The second ferromagnetic material 1610 forms columns. As illustrated in FIG. 16A, the structure 1600 includes vertical ferromagnetic laminations formed of the first ferromagnetic material 460 and the second ferromagnetic material 1610, the vertical laminations separated by oxide film layers 1410.

In step 1250, the masking material and the conductive seed layer in the regions outside of the core are removed. The masking material in the regions outside of the core can be removed by using a solvent that removes crosslinked portions of the masking material through chemical reactions. Following removal of the masking material, the conductive seed layer can be removed by a subtractive wet or dry etch. Photolithography and photoresist can be used to prevent etching of materials in the core region. FIGS. 17A and 17B illustrate a cross-sectional view and a top view, respectively, of the structure 1700 formed in step 1240. As illustrated, the substrate 400 is exposed in the regions 1510, 1520 outside of core region 450. A portion of the conductive seed layer 410 may or may not be exposed proximal to the edge of core region 450 adjacent to the last oxide film layer 1410 of the vertically laminated core.

In step 1260, a passivation layer is deposited on the structure formed as a result of step 1250. The passivation layer can be an insulator material such as silicon dioxide, silicon nitride or polyimide. In some embodiments, the passivation layer is the same as core insulator layer 265 described above. FIGS. 18A and 18B illustrate a cross-sectional view and a top view, respectively, of the structure 1800 formed in step 1260. As illustrated, the passivation layer 1810 is deposited on the vertically-laminated core, on the exposed seed layer 410, and on substrate 400 in the regions outside of core region 450.

In step 1270 (FIG. 12), a conductive winding is formed around the vertically-laminated core. The conductive winding can be formed in a portion of a multilevel wiring structure as illustrated in FIG. 1. The conductive winding can be fabricated using known semiconductor processes, such as with physical vapor deposition and electrodeposition of conductive materials to form the wiring levels and VIAs.

FIG. 19 is a side view of an apparatus 1900 for electrodepositing ferromagnetic material in the presence of an electric field according to one or more embodiments. The apparatus 1900 includes an electrodeposition tank 1910 that holds an electrolytic or electroplating solution 1920. A substrate 1930 is disposed on electroplating cathode 1940 in the tank 1910. An anode 1945 is in electrical communication with the electroplating solution 1920 in tank 1910. During deposition, a current is applied to the anode 1945, which causes ferromagnetic material to be electrodeposited on the substrate 1930 at cathode 1940. Also during deposition, a magnetic field 1950 (as illustrated by the dashed lines) is generated by first and second magnetic coils 1960, 1970. The magnetic field 1950 is orthogonal to the major planar surfaces of substrate 1930. The magnetic field 1950 is also parallel to the vertical columns or mesas of masking or insulator material 1935 deposited on substrate 1930.

The magnetic coils 1960, 1970 can be electromagnets such as Helmholtz coils powered by a DC power supply. Such Helmholtz coils can produce a uniform or substantially uniform magnetic field transverse to the plane defining a surface of substrate 1930. The magnetic field generated by the Helmholtz coils can be about 10 Oe to about 100 Oe, about 25 Oe, about 50 Oe, about 75 Oe, or any value or range between any two of the foregoing values. Alternatively, magnetic coils 1960, 1970 can be permanent magnets that can generate a magnetic field of about 20 Oe to about 10,000 Oe, about 2,500 Oe, about 5,000 Oe, about 7,500 Oe, or any value or range between any two of the foregoing values. The magnetic field 1950 generated by magnetic coils 1960, 1970 induces an easy axis of magnetization to the electrodeposited ferromagnetic material that is parallel to the magnetic field lines 1950.

FIG. 20 is a detailed view of the orientation of the magnetic field with respect to the substrate and patterned columns or mesas of masking or insulator material 1935. As illustrated, the magnetic field lines 1950 are orthogonal to planar surface 1905 of substrate 1930. The magnetic field lines 1950 are also parallel to the vertical columns or mesas of masking or insulator material 1935, which extend from the plating material seed layer 1910 along an axis 1945 that is orthogonal to planar surface 1905 of substrate 1930.

FIG. 21 is a detailed view of the orientation of the substrate 1930 after ferromagnetic material 2110 has been electrodeposited as vertical laminations between patterned columns of insulator material 1935 in the presence of magnetic field 1950. As illustrated, the magnetic field 1950 induces an easy axis of magnetization 2120 in the electrodeposited ferromagnetic material 2110 that aligns with and is parallel to the magnetic field 1950 and that is parallel to axis 1945. Aligning the easy axis of magnetization 2120 with the magnetic field 1950 induces a hard axis of magnetization 2130 in the electrodeposited ferromagnetic material 2110, the hard axis lying in a plane that is orthogonal to axis 1945 and the easy axis of magnetization 2130 (e.g., out of the page in FIG. 21). The cross-sectional plane illustrated in FIG. 21 in orthogonal to the major planar surfaces of substrate 1930 and seed layer 1910.

It is noted that although the columns/mesas of masking material are illustrated as horizontal in FIGS. 19-21, other orientations are possible provided that the magnetic coils 1960, 1970 are configured to generate a magnetic field that is parallel to the vertical columns or mesas of masking or insulator material, as described above. For example, the apparatus 1900 and substrate 1930 can be rotated counterclockwise by 90 degrees such that the substrate 1930 is horizontal and the columns/mesas are vertical. Rotating the apparatus 1900 counterclockwise by 90 degrees would cause magnetic coil 1960 to be below tank 1910 and magnetic coil 1970 to be above tank 1910. The relative orientation of the magnetic field 1950, substrate 1930, and columns/mesas 1935 would remain the same, where the magnetic field 1950 are orthogonal to planar surface 1905 of substrate 1930. The magnetic field lines 1950 are also parallel to the vertical columns or mesas of masking or insulator material 1935

FIGS. 22A-C are top views of various patterns 2201-2203 in a masking material for electrodepositing vertically-laminated ferromagnetic material according to one or more embodiments. The patterns in the masking material expose a conductive seed layer where the ferromagnetic material is electrodeposited, as described above. Pattern 2201 includes a plurality of (e.g., three) concentric circles, where adjacent concentric circles are separated by a portion of the masking material to separate the vertical laminations. Pattern 2202 includes a plurality of (e.g., four) rectangular shapes, which can have square or rounded corners. Adjacent rectangular shapes are separated by a portion of the masking material to separate the vertical laminations. Pattern 2203 is a dual core, each core comprising strips or columns separated by masking material to separate the vertical laminations. The patterns 2201-2203 are illustrative of the different patterns for vertical laminations that can be formed in the masking material, which are within the scope of this disclosure.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

The invention claimed is:

1. A method of manufacturing an inductor comprising a laminated ferromagnetic core, comprising:
   depositing a conductive seed layer on a planar surface, the planar surface disposed above a substrate;
   depositing a masking insulator layer on the conductive seed layer and defining a pattern in the masking insulator layer, via photolithography or a subtractive wet or dry etch, to form exposed portions of the conductive seed layer between adjacent patterned portions of the masking insulator layer;
   depositing a plurality of ferromagnetic layers on the exposed portions of the conductive seed layer, each ferromagnetic layer disposed on one of said exposed portions of the conductive seed layer and having a height extending from the conductive seed layer along a first axis, said first axis orthogonal to the planar surface;
   forming said laminated ferromagnetic core wherein the ferromagnetic layers and the patterned portions of the masking insulator layer comprise alternating layers; and
   forming a conductive winding around the laminated ferromagnetic core.

2. The method of claim 1, wherein the ferromagnetic layers are deposited by electrodeposition.

3. The method of claim 2, further comprising applying a magnetic field during the electrodeposition of the ferromagnetic layers, the magnetic field being aligned with the height of each ferromagnetic layer, to permanently induce an easy axis of magnetization in each ferromagnetic layer, said easy axis of magnetization parallel to said first axis.

4. The method of claim 3, further comprising permanently inducing a hard axis of magnetization in each ferromagnetic layer, said hard axis of magnetization lying in a plane that is orthogonal to said first axis.

5. A method of manufacturing an inductor comprising a laminated ferromagnetic core, comprising:
   depositing a conductive seed layer on a planar surface, the planar surface disposed above a substrate;
   depositing a masking insulator layer on the conductive seed layer to form a layered structure comprising the substrate, the planar surface, the masking insulator layer, and the conductive seed layer;
   defining a pattern in the masking insulator layer, the pattern located in a first region of the layered structure, the first region corresponding to the laminated ferromagnetic core;
   forming voids in the masking insulator layer according to the pattern, the voids extending to the conductive seed layer to form exposed portions of the conductive seed layer between adjacent patterned portions of the masking insulator layer;
   electrodepositing a ferromagnetic material on the exposed portions of the conductive seed layer to form columns of the ferromagnetic material, wherein the patterned portions of the masking insulator layer and the columns of the ferromagnetic material in the first region comprise alternating layers of the laminated ferromagnetic core; and
   forming a conductive winding around the laminated ferromagnetic core.

6. The method of claim 5, further comprising:
   removing the masking insulator layer and the underlying conductive seed layer from a second region of the layered structure to expose the planar surface on the substrate, the second region corresponding to a region outside of the ferromagnetic core; and
   depositing a passivation layer on the first and second regions of the layered structure, such that the passivation layer is disposed on the laminated ferromagnetic core in the first region and the passivation layer is disposed on the planar surface in the second region.

7. The method of claim 5, further comprising applying a magnetic field during the electrodepositing step, the magnetic field aligned with a height of each column of the ferromagnetic material, said height extending from the conductive seed layer along a first axis, said first axis orthogonal to the planar surface.

8. The method of claim 7, wherein the magnetic field induces (a) a permanent easy axis of magnetization parallel to said first axis in the ferromagnetic material and (b) a permanent hard axis of magnetization in the ferromagnetic material, said hard axis of magnetization lying in a plane that is orthogonal to said first axis.

9. The method of claim 5, wherein the masking insulator layer comprises a photoimageable polymer.

10. The method of claim 9, wherein the pattern is defined by selectively exposing portions of the photoimageable polymer to light using photolithography, resulting in exposed portions and unexposed portions of the photoimageable polymer in the first region of the layered structure.

11. The method of claim 10, wherein the voids are formed by removing the unexposed portions of the photoimageable polymer using a solvent.

12. The method of claim 5, wherein the masking insulator material comprises at least one of silicon dioxide, $Si_xN_y$, or a polymer.

13. The method of claim 12, wherein the pattern is defined by a subtractive wet or dry etch.

14. A method of manufacturing an inductor comprising a laminated ferromagnetic core, comprising:
   depositing a conductive seed layer on a planar surface, the planar surface disposed above a substrate;

depositing a masking layer on the conductive seed layer to form a layered structure comprising the substrate, the planar surface, the masking layer, and the conductive seed layer;

defining a pattern in the masking layer, the pattern located in a first region of the layered structure, the first region corresponding to the laminated ferromagnetic core;

forming voids in the masking layer according to the pattern, the voids extending to the conductive seed layer to form exposed portions of the conductive seed layer;

electrodepositing a first ferromagnetic material on the exposed portions of the conductive seed layer to form columns of the first ferromagnetic material;

removing the masking material from the first region of the layered structure to form gaps between adjacent columns of the first ferromagnetic material, the gaps exposing the conductive seed layer;

forming an oxide film layer on each opposing sidewall of each column of the first ferromagnetic material, the oxide film layer comprising an oxide of said first ferromagnetic material;

electrodepositing a second ferromagnetic material on the conductive seed layer in each gap between adjacent columns of the first ferromagnetic material to form columns of the second ferromagnetic material, the oxide film disposed between each column of the first ferromagnetic material and each column of the second ferromagnetic material, wherein the laminated ferromagnetic core comprises the columns of the first ferromagnetic material, the columns of the second ferromagnetic material, and the oxide film layers; and forming a conductive winding around the laminated ferromagnetic core.

15. The method of claim 14, wherein the oxide film layers are formed by heating the columns of the first ferromagnetic material to a temperature of about 100° C. to about 500° C. following the removal of the masking material.

16. The method of claim 14, further comprising applying a first magnetic field during the electrodepositing of the first ferromagnetic material, the first magnetic field aligned with a height of each column of the first ferromagnetic material, said height extending from the conductive seed layer along a first axis, said first axis orthogonal to the planar surface.

17. The method of claim 16, wherein the first magnetic field induces (a) a permanent easy axis of magnetization parallel to said first axis in the first ferromagnetic material and (b) a permanent hard axis of magnetization in the first ferromagnetic material, said permanent hard axis of magnetization lying in a plane that is orthogonal to said first axis.

18. The method of claim 17, further comprising applying a second magnetic field during the electrodepositing of the second ferromagnetic material, the second magnetic field aligned with a height of each column of the second ferromagnetic material, said height extending from the conductive seed layer along said first axis.

19. The method of claim 18, wherein the second magnetic field induces (a) a permanent easy axis of magnetization parallel to said first axis in the second ferromagnetic material and (b) a permanent hard axis of magnetization, parallel to said hard axis of magnetization in the first ferromagnetic material, in the second ferromagnetic material.

* * * * *